(12) United States Patent
Cencini et al.

(10) Patent No.: US 10,432,473 B2
(45) Date of Patent: Oct. 1, 2019

(54) SENSING LOCATION OF RACK COMPONENTS

(71) Applicant: Vapor IO Inc., Austin, TX (US)

(72) Inventors: Andrew Cencini, Austin, TX (US); Steven White, Austin, TX (US); Dave Kaplin, Austin, TX (US); Cole Malone Crawford, Austin, TX (US)

(73) Assignee: Vapor IO Inc., Austin, TX (US)

( * ) Notice: Subject to any disclaimer, the term of this patent is extended or adjusted under 35 U.S.C. 154(b) by 198 days.

(21) Appl. No.: 15/337,732

(22) Filed: Oct. 28, 2016

(65) Prior Publication Data
US 2017/0126505 A1    May 4, 2017

Related U.S. Application Data

(60) Provisional application No. 62/275,909, filed on Jan. 7, 2016, provisional application No. 62/248,788, filed on Oct. 30, 2015.

(51) Int. Cl.
*H04L 12/24* (2006.01)
*G06K 7/10* (2006.01)
(Continued)

(52) U.S. Cl.
CPC .......... *H04L 41/12* (2013.01); *G06K 7/10366* (2013.01); *G06K 7/10881* (2013.01); *G06K 7/1413* (2013.01); *G06K 19/06028* (2013.01); *G06K 19/07758* (2013.01); *H01R 12/721* (2013.01); *H01R 25/16* (2013.01); *H02H 7/20* (2013.01); *H02J 7/0052* (2013.01); *H02J 9/061* (2013.01); *H02M 3/158* (2013.01);
(Continued)

(58) Field of Classification Search
CPC ......... H04L 41/12; H04L 67/10; H04L 67/12; H04L 67/18; H04L 67/22; H04L 12/10; G06K 7/10366; G06K 7/10881; G06K 7/1413; G06K 19/06028; G06K 19/07758; H01R 12/721; H01R 25/16; H05K 5/0069; H05K 7/1488; H05K 7/1498; H05K 7/20736; H05K 7/20836
See application file for complete search history.

(56) References Cited

U.S. PATENT DOCUMENTS 7,857,214 B2 * 12/2010 Saliaris ................... G06F 1/181
                                                          235/383
2003/0046339 A1    3/2003 Ip
(Continued)

OTHER PUBLICATIONS

International Search Report and Written Opinion for Related PCT Application PCT/US2016/059417 dated Jan. 31, 2017, pp. 1 to 10.

*Primary Examiner* — Viet D Vu
(74) *Attorney, Agent, or Firm* — Pillsbury Winthrop Shaw Pittman LLP

(57) ABSTRACT

Provided is a method of localizing rack-mounted computing devices, the method comprising: receiving, with a direct current (DC) power bus or via an Ethernet control network or data network, a request from a control unit for a rack computing device location; generating, with a sensor, output signals conveying information related to a location of the rack-mounted computing device; and sending, with the direct current (DC) power bus or via an Ethernet control network or data network, location information of the rack-mounted computing device.

27 Claims, 16 Drawing Sheets

(51) Int. Cl.
    *G06K 7/14*     (2006.01)
    *G06K 19/06*     (2006.01)
    *G06K 19/077*     (2006.01)
    *H04L 29/08*     (2006.01)
    *H02J 7/00*     (2006.01)
    *H02J 9/06*     (2006.01)
    *H02M 3/158*     (2006.01)
    *H02M 7/44*     (2006.01)
    *H01R 12/72*     (2011.01)
    *H01R 25/16*     (2006.01)
    *H02H 7/20*     (2006.01)
    *H02M 7/04*     (2006.01)
    *H05K 5/00*     (2006.01)
    *H05K 7/14*     (2006.01)
    *H05K 7/20*     (2006.01)
    *H04L 12/10*     (2006.01)
    *H04W 4/02*     (2018.01)

(52) U.S. Cl.
    CPC ............... *H02M 7/04* (2013.01); *H02M 7/44* (2013.01); *H04L 67/10* (2013.01); *H04L 67/12* (2013.01); *H04L 67/18* (2013.01); *H04L 67/22* (2013.01); *H05K 5/0069* (2013.01); *H05K 7/1488* (2013.01); *H05K 7/1498* (2013.01); *H05K 7/20736* (2013.01); *H05K 7/20836* (2013.01); *H04L 12/10* (2013.01); *H04W 4/023* (2013.01)

(56) References Cited

U.S. PATENT DOCUMENTS

| | | |
|---|---|---|
| 2007/0222597 A1 | 9/2007 | Tourrilhes et al. |
| 2009/0210755 A1* | 8/2009 | Sawczak ............... G06F 1/206 714/57 |
| 2011/0084839 A1 | 4/2011 | Groth et al. |
| 2011/0258302 A1* | 10/2011 | Cole ..................... G06F 11/006 709/223 |
| 2012/0039612 A1 | 2/2012 | Piazza |
| 2013/0241699 A1* | 9/2013 | Covaro ............. G06K 7/10009 340/10.1 |
| 2014/0253093 A1 | 9/2014 | Bermudez et al. |
| 2018/0007809 A1* | 1/2018 | Kesavaperumal ... H04B 5/0062 |

* cited by examiner

SENSING LOCATION OF RACK COMPONENTS

CROSS-REFERENCE TO RELATED APPLICATIONS

The present application claims the benefit of the following U.S. Provisional Patent Applications: U.S. 62/248,788, filed 30 Oct. 2015; and US 62/275,909, filed 7 Jan. 2016. The entire content of each parent application is incorporated by reference in its entirety.

BACKGROUND

1. Field

The present invention relates generally to location awareness of racks and rack components and, more specifically to localizing rack-mounted computing devices.

2. Description of the Related Art

Computer-equipment racks, such as server racks, are generally used to house and in some cases interconnect collections of computing devices, like servers and associated storage, power supplies, network switches, and the like. In many cases, the computing devices are relatively numerous and arranged in relatively-dense arrays due to the cost of space appropriate to store such computing devices and the desire to reduce latency by having the devices close to one another.

Often, locating an individual computing device among a large number of racks (e.g., tens, hundreds or sometimes thousands of racks) can be challenging. Generally, large data centers rely on naming schemes, human keying, network correlation and other similar addressing schemes to track physical location of the computing devices. These and other methods are often impractical and error-prone, which may result in incorrect equipment being serviced, or items needing to be serviced to being instead missed, for example.

SUMMARY

The following is a non-exhaustive listing of some aspects of the present techniques. These and other aspects are described in the following disclosure.

Some aspects include is a process of localizing rack-mounted computing devices, the process including: receiving, with a direct current (DC) power bus, a request from a control unit for a rack computing device location; generating, with a sensor, output signals conveying information related to a location of the rack-mounted computing device; and sending, with the direct current (DC) power bus, location information of the rack-mounted computing device.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
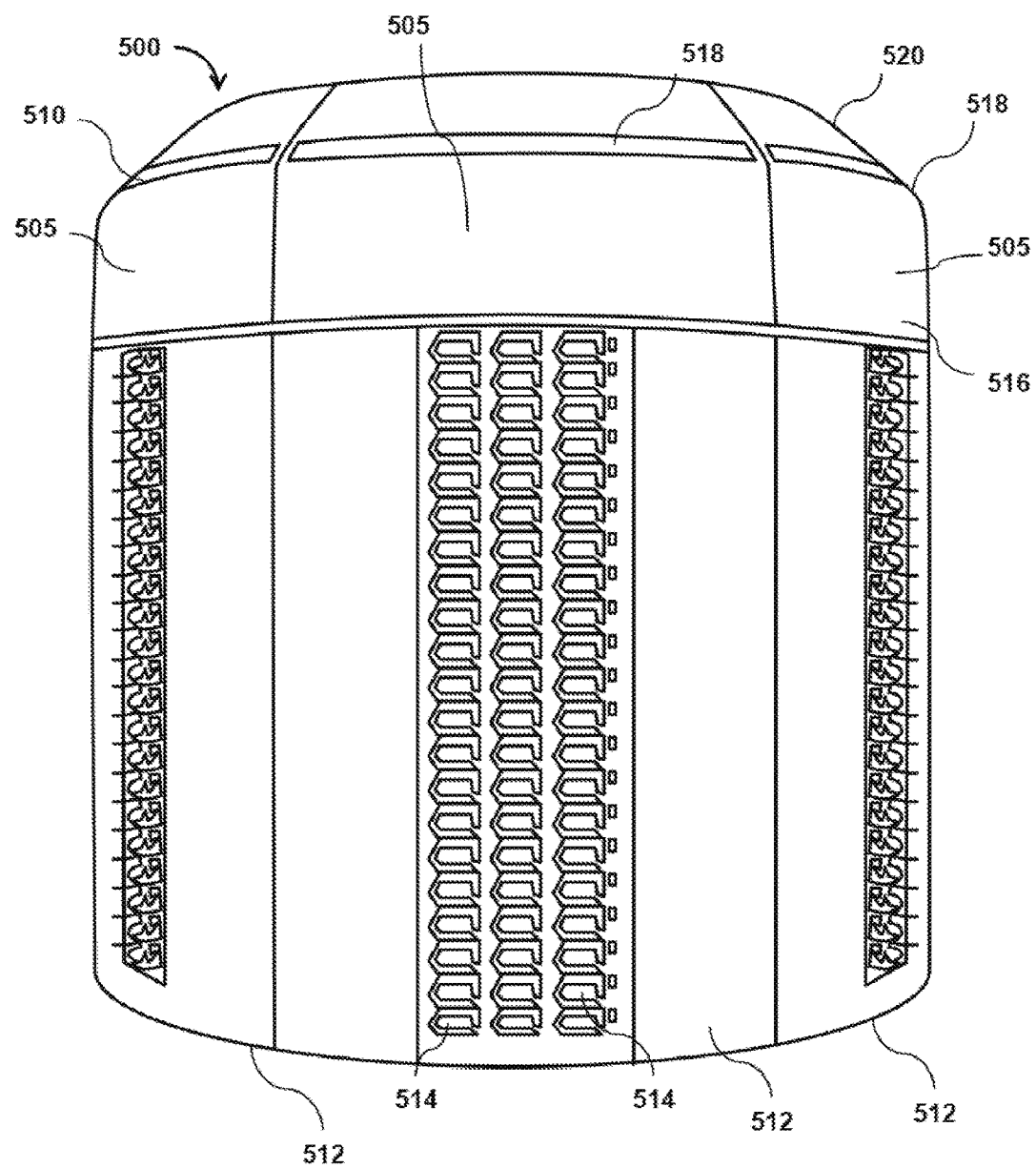
FIG. 1 illustrates an example of a cylindrical datacenter chamber, in accordance with some embodiments.

While the invention is susceptible to various modifications and alternative forms, specific embodiments thereof are shown by way of example in the drawings and will herein be described in detail. The drawings may not be to scale. It should be understood, however, that the drawings and detailed description thereto are not intended to limit the invention to the particular form disclosed, but to the contrary, the intention is to cover all modifications, equivalents, and alternatives falling within the spirit and scope of the present invention as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of data center equipment design. Indeed, the inventors wish to emphasize the difficulty of recognizing those problems that are nascent and will become much more apparent in the future should trends in the data center industry continue as applicants expect. Further, because multiple problems are addressed, it should be understood that some embodiments are problem-specific, and not all embodiments address every problem with traditional systems described herein or provide every benefit described herein. That said, improvements that solve various permutations of these problems are described below.

Reliable knowledge of the precise location of a piece of equipment in a data center has long been an unsolved problem, particularly for larger data centers. Knowledge of this information assists in ensuring that the correct equipment is being serviced, as well as in helping to visualize and model the physical characteristics and layout of data centers and the equipment within. In some cases, the design of network equipment, where network ports and Ethernet addresses are generally not tied to a physical location, it is typically impractical, error-prone, or impossible to correlate network port information with a physical location. Generally, typical large data centers may rely on naming schemes, human keying, network correlation and other similar semantics to semi-reliably track physical location. Some have attempted to signal the location of equipment based on a server making physical contact with wired pins upon being inserted in a rack, but these arrangements are often unreliable, as the pins are often physically damaged during insertion.

Some embodiments may mitigate some, and in some cases, all of these issues. In some embodiments, locational sensors may be used to obtain and present pertinent locational information. In some embodiments, data may be read off the locational sensors, may be stored in the computing device or in the microcontroller for power-line modem described below, and may be conveyed via the power-line modem. Or some embodiments may send this information via a traditional Ethernet control network or data network of a data center. In some embodiments retrieving data from the locational sensors may be done remotely, for example with centralized components, like a control unit for a rack or for a datacenter (e.g., remote management controller acting as the rack level control unit). In some cases, these techniques are implemented the context of a computing environment described below with reference to FIGS. 1-13 and 16, though embodiments of the locational sensors have applicability outside this context, e.g., in traditional rack designs.

Figure 3:
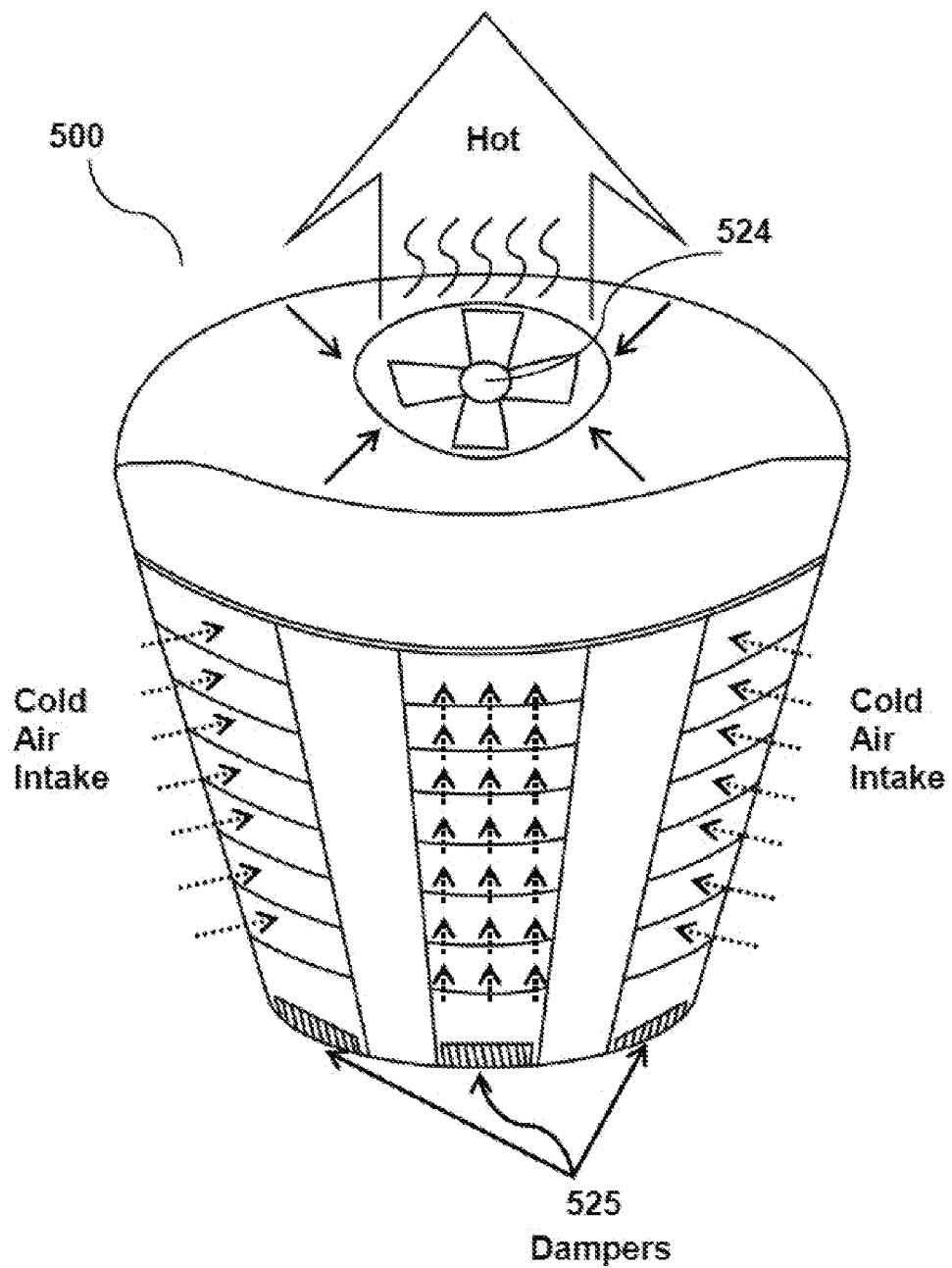
FIGS. 3-4 illustrate operation of the cylindrical datacenter chamber of FIG. 1, in accordance with some embodiments.
Figure 4:
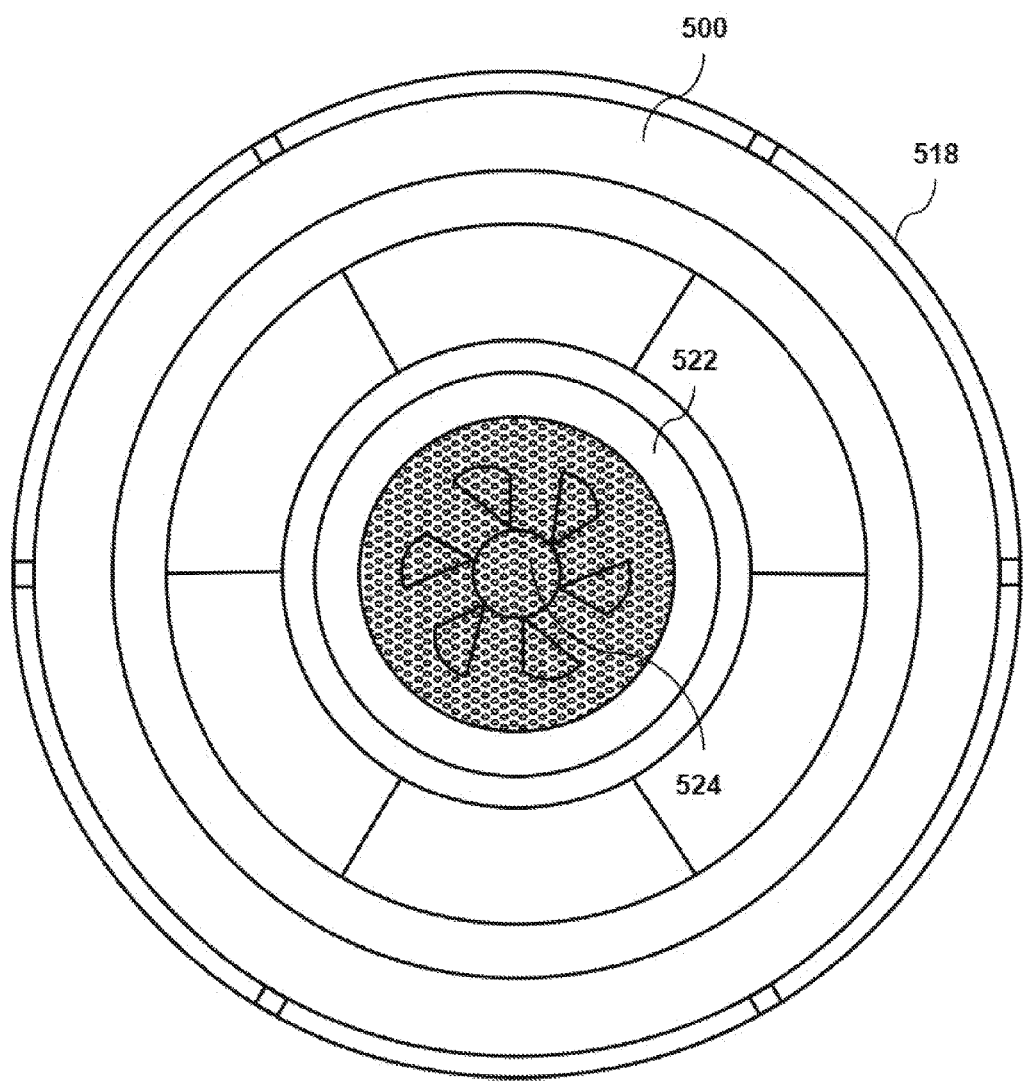
Figure 5:
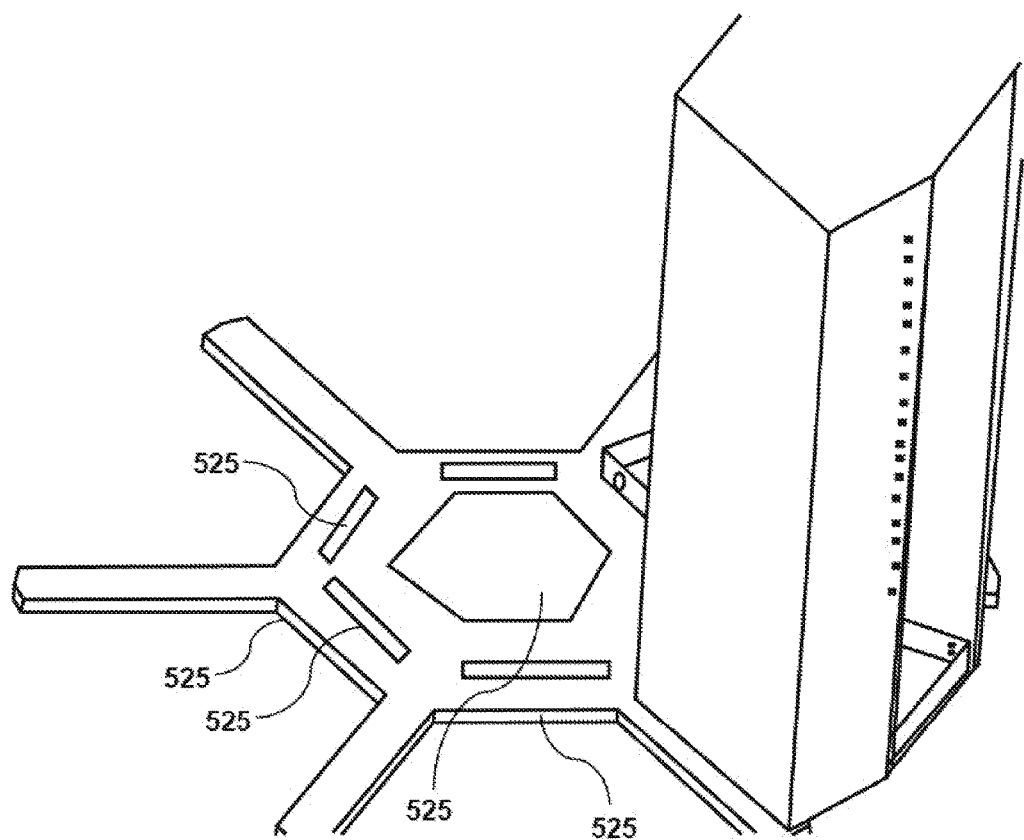
FIG. 5 illustrates examples of components of the cylindrical datacenter chamber of FIG. 1, in accordance with some embodiments.

FIG. 1 depicts an embodiment of a datacenter chamber 500 in accordance with some of the present techniques. In some embodiments, datacenter 500 includes a collection of adjacent racks arrayed non-linearly (e.g., in a circle, oval, square, etc.) so as to at least partially define an interior chamber (e.g., by fully enclosing the interior chamber in a horizontal plane, or by partially enclosing the interior chamber, like by defining a concave area in the plane). The interior chamber defines a compartment through which cooling fluid flows, in some cases having a substantially an empty space through which cooling fluid like air may flow. Some embodiments may provide for a generally cylindrical datacenter chamber 500, having a plurality of wedge racks, each with a stack of vertically arrayed, outward facing servers. Wedge-shaped racks generally have an outer portion (further from the interior chamber) that is wider than an inner portion (adjacent the interior chamber). This arrangement is expected to allow for relatively easy access to equipment on the wedge racks (e.g., for maintenance, cabling, installation, etc.) An integrated cooling or ventilation system may be provided by which air is drawn or pushed through the inner chamber (e.g., via fans near the top or bottom of the inner chamber as shown in FIGS. 3-4 and described below). Additionally, or alternatively, in some embodiments, ducting may be coupled to the column, the data center pressurized, and air may flow through the ducting to a region at a lower pressure (or the ducting may be driven to a lower pressure than a data center at ambient air pressure). Finally, arranging can be challenging due to the weight of the racks, particularly when the body of the racks serves to constrain and direct airflow, often leading to relatively narrow tolerances for mating between adjacent racks. Some embodiments may include a guiding and seating system for aligning the racks during assembly, as described below.

In some cases, the chamber may form a relatively self-contained unit, having cooling infrastructure independent of building-provided heating, ventilation, and air conditioning (HVAC). In some cases, the chamber may also have power conditioning circuitry (e.g., rectifiers, low-pass filters, and surge-protectors) and back-up power supplies (e.g., batteries). In some embodiments, each chamber includes an integrated, self-contained compute fabric by which computing devices are interconnected. A relatively self-contained chamber 500 as described above may provide benefits such as easy shipping, easy access to components within the chamber, cost effective heat and humidity control, and independency from other infrastructure (e.g., datacenter building, other datacenter units, etc.). That said, several independently useful inventions are described, so not all embodiments provide all of these benefits.

FIG. 1 shows an example of a chamber 500 including a plurality of racks 505 configured to hold arrays of rack-mounted computing devices 514. Racks 505 are arranged non-linearly (e.g., in a rotationally symmetric array) to define chamber 500 and the interior chamber (shown in later views). Racks 505, in some embodiments, are "wedge racks" shaped to define the interior chamber when placed adjacent one another, for instance, by forming a wedge-shape in their horizontal cross section. In some embodiments, wedge racks 505 may be arranged into a shape such as a triangle, square, hexagon, or octagon with the back sides all facing towards (and in some cases partially or entirely defining) the interior chamber. In some embodiments, the chamber 500 may have a generally cylindrical shape, e.g., a circular cylindrical shape. In some embodiments, the chamber 500 may be generally rotationally symmetric about a vertical axis extending through the center of the chamber 500. In some embodiments, the interior chamber of datacenter chamber 500 (shown in FIGS. 3 and 4) may generally be of cylindrical shape. In some cases, the interior chamber of datacenter chamber 500 may define (e.g., approximate) a right cylinder with a base having a variety of shapes consistent with the present techniques, e.g., a rectangular, triangular, pentagonal, hexagonal, heptagonal, octagonal, decagonal, dodecagonal, or elliptical. In some cases, the interior chamber may define a tapered shape, such as an inverted cone, in which the diameter of the bottom is larger than the top or vice versa.

In some embodiments, chamber 500 provides front side rack access (the outer perimeter of the chamber) to access three categories of information technology interfaces (e.g., of computing devices 514): compute; network, and storage. In some embodiments, the components by which the computing devices are connected to power and one another may be accessible from the exterior of the chamber, e.g., the inner column may be generally or fully devoid of such connections, or alternate connections may be accessible from the exterior. (Or some embodiments may include such connections in the interior.)

In some embodiments, a lid 510 is configured to fit on top of the wedge racks. Lid 510 may include an upper portion 520 and a lower portion 516 (on the opposite side of the upper portion vertically) and an illumination strip 518, behind which may reside an array of light emitting diodes connected to a rack controller. Light color, intensity, and flashing rates or patterns may indicate status of computing devices in the rack. Lid 510 may define an empty chamber space located between lower portion 516 (where lid 510 and the wedge racks connect) and upper portion 520 of lid 510. The empty space may house wiring and a top-of-rack network switch in some embodiments. In some cases, chamber 500 may include a leveling base 512 described with reference to FIGS. 11-13.

In some cases, the number of wedge racks 505 is at least three racks, e.g., five racks or six racks, or more. In some embodiments, each wedge rack 505 may be substantially identical to the other wedge racks, and each receptacle, called a "U" in each rack may be substantially identical to the others. In some embodiments, when assembled, the orientation of the wedge racks may differ by an amount less than 180 degrees, e.g., less than 90 degrees. In some embodiments, as described below, each wedge rack may be engineered with a holistic embedded systems engineering methodology to allow the rack to function as a "device"/ "appliance", and not as a traditional rack/row architecture, which is expected to be particularly advantageous in web-scale applications. In some embodiments, chamber 500 may eliminate traditional "U's" of measurement by integrating the "pitch" into the chamber itself. That said, embodiments are not limited to systems that provide these benefits, as various independently useful techniques are described here, which is not to suggest that any other feature may not be omitted in some cases.

In some cases, the datacenter chamber 500 may house more than 50 U's of computing devices 514 and may span more than 5 feet in diameter (e.g., approximately 9 feet). Further, in some cases, the racks in the chamber may be approximately the height of a person, e.g., on the order of six feet tall to facilitate access by technicians (e.g., five feet or higher). In some embodiments, one or more datacenter chambers may be part of a modular data center that can be placed where data capacity is needed. This may allow for rapid deployment, energy efficiency, high-density computing, and cost reduction (though embodiments are also consistent with a non-modular design).

Figure 2:
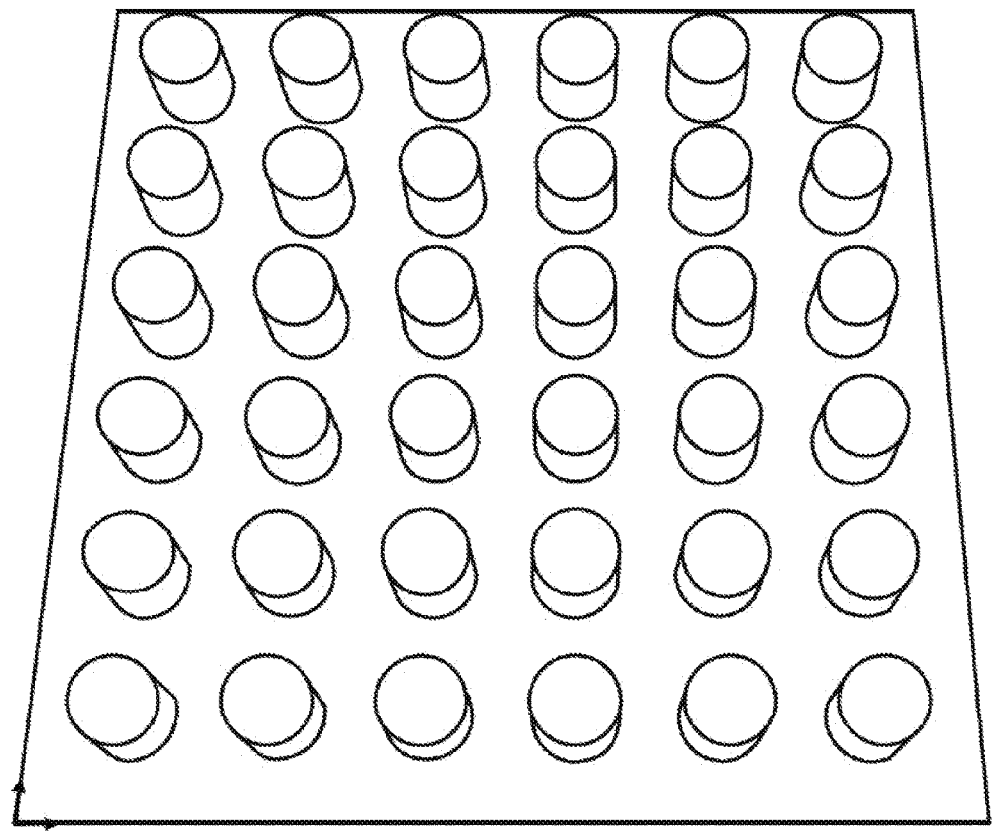
FIG. 2 illustrates a datacenter having an array of cylindrical datacenter chambers of FIG. 1, in accordance with some embodiments.

In some embodiments, a plurality of datacenter chamber 500 may be may be arranged in a datacenter. FIG. 2 illustrates an example of a datacenter having an array of cylindrical datacenter chambers. In some embodiments, the chambers may be arranged in a square or a hexagonal lattice, or other arrangements. In some cases, one or more datacenter chambers 500 may be added to existing data centers with or without similar characteristics (e.g., having different server rack units). In some embodiments, one or more datacenter chambers 500 may be containerized for easy transportation. For example, datacenter chambers 500 (with or without datacenter equipment) may be configured to fit into a standard shipping container, which is then transported to a desired location. Datacenter chamber 500 may be advantageous for use in portable data center environments at least because of its integrated cooling or ventilation system capacity as will be discussed below.

Controlling air temperature and humidity in the chamber (and in a datacenter in general) is expected to help protect equipment from malfunction and damage. In some cases it may also reduce power consumption and cost. For example, temperatures in a datacenter chamber 500 may rise because of the amount of power used in the datacenter chamber which may cause heat damage to equipment on the wedge racks. High humidity may cause water to condense on internal components within the datacenter chamber. Low humidity may cause static electricity discharge problems which may damage components within the datacenter chamber. A variety of arrangements may direct air to flow circumferentially inward or outward to cool rack-mounted computing equipment. In the illustrated embodiment, wedge racks 505 of chamber 500 (FIG. 1) are arranged into a cylindrical shape (or they may be arranged in other shapes described above such as a square, hexagon, or octagon with the back sides all facing towards the center). This, in some cases, allows outside cold air to be pulled (or pushed) in from several (e.g., all horizontal) directions to cool equipment in chamber 500. The cold (e.g., relative to the computing equipment) air may flow over the computing devices, drawing heat therefrom, and into the interior cylinder. From the cylinder, the air may be exhausted through a fan that drives the airflow as shown by the arrows in FIG. 3.

The incoming air is heated as it passes across heatsinks (pulling waste heat from computing equipment) and other warm components inside the equipment, in these embodiments. In some embodiments, the hot air exits the backs of the wedge racks and enters the inner chamber and exits through the top of the chamber. FIGS. 3-4 illustrate operation of the chamber of FIG. 1, in accordance with some embodiments. Cold air may be pulled or pushed from all directions of chamber 500, drawn to the inner chamber and exits through an exhaust output (e.g., output 522 of FIG. 4) in the top of chamber 500. (Or the flow may be reversed.) In some embodiments, a lid (e.g., lid 510 of FIG. 1) configured to cover the top of the chamber serves as a barrier that prevents the hot air from mixing back in with the cold air. In some embodiments, a fan 524 in FIGS. 3-4, or an array of fans may be arranged and positioned in the top of the lid and configured to pull the hot air upward. In some cases, the fan may be configured to pull the hot air into ductwork that routes the air elsewhere.

In some embodiments, chamber 500 may include dampers configured to adjust the flow of air. FIG. 3 illustrates an example of dampers 525. In some cases, dampers 525 in FIGS. 3 and 5, located at the base of the chamber may be used to adjust the flow of air. In some embodiments, the dampers may include one or more valves, or plates configured to control, stop, or regulate the flow of air inside chamber 500. In some embodiments, one or more dampers may be manual (e.g., using a manual handle to control the damper), or automatic (e.g., using motors that are controlled by a thermostat). Industry recommended temperatures generally range between 64 and 81° F., a dew point range between 41 and 59° F., and a maximum relative humidity of 60. In some embodiments, temperatures may range between 59 and 90° F.

In some embodiments, chamber 500 may include an integrated cooling system configured for directing air to flow circumferentially inward or outward to cool rack-mounted computing equipment, for instance, by driving a cooling fluid along computing devices mounted in the wedge racks of chamber 500 and through the interior chamber of chamber 500. The present techniques are described with reference to a cooling gas (air), but are consistent with other fluids, e.g., in systems immersed in mineral oil. In some embodiments, the integrated cooling system of chamber 500 is independent from other cooling systems (e.g., for other chambers in the datacenter, for the room where the datacenter is located, or for the building where the datacenter is located). In some cases, the integrated cooling system of chamber 500 may be controlled in concert with other cooling systems for other chambers, for the room or for the building. Cooling systems, humidifiers, ventilators, or other temperature and humidity control systems may be used to help control air temperature and humidity. In some embodiments, the integrated cooling system of chamber 500 may be configured to provide cooling and humidity control by directly drawing fresh air into the cooling system (e.g., through a vent, duct, etc.) In some embodiments, the integrated cooling system may be a portable cooling system. In other cases, the integrated cooling system maybe an integral part of chamber 500 (e.g., part of the chassis described below).

The integrated cooling system of chamber 500 may use one or more different techniques for forcing air to flow over computing equipment mounted in the wedge-shaped racks. For example, the cooling system may drive a cooling fluid (e.g., air, gas, water, chemicals, or other cooling fluids) along equipment in chamber 500 and through the interior chamber with a pump, like a centrifugal pump, in the case of liquids, or a fan, in the case of gases. The cool fluid is heated as it passes through equipment and is driven out of the chamber. For example in case of air or other gases, the heated fluid may be driven out by a fan located near an end of the interior chamber e.g., top (or located elsewhere within, or near to chamber 500) to a duct or a vent. Or in the case of cooling liquids, the heated liquid may be directed out of the chamber and into a heat exchanger using a pump.

For instance, in some embodiments, chamber 500 may include an integrated ventilation infrastructure. In some embodiments, the integrated ventilation infrastructure of chamber 500 is independent of other ventilation systems of other chambers, room, or building. In some cases, the integrated ventilation infrastructure may be controlled in concert with ventilation of other chambers in the datacenter, ventilation of the room, or building. In some embodiments, the ventilation infrastructure may include one or more fans in series or parallel.

Figure 6:
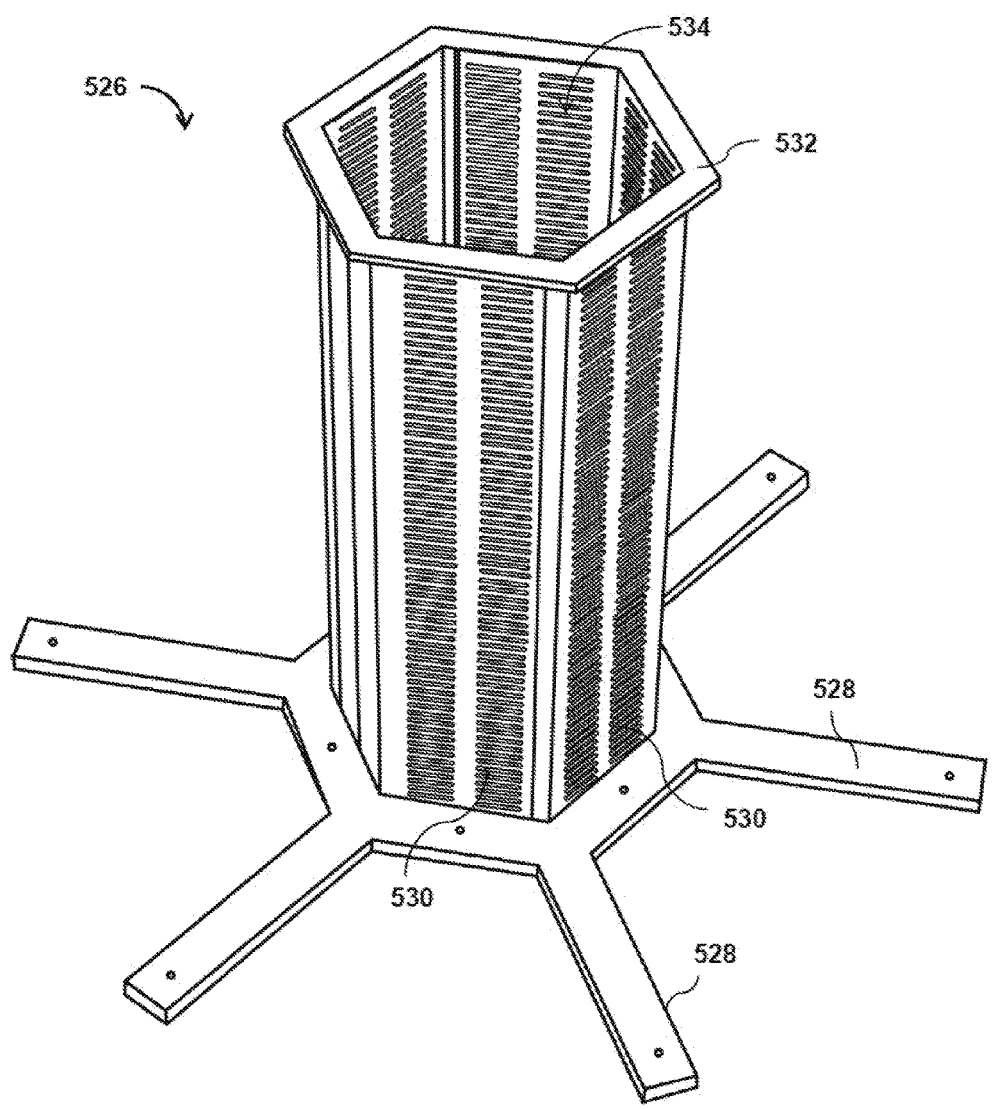
FIG. 6 illustrates a chassis of the cylindrical datacenter chamber of FIG. 1, in accordance with some embodiments.

FIG. 6 illustrates a chassis 526 of the datacenter chamber 500 of FIG. 1, in accordance with some embodiments. Chassis 526 may be configured to secure one or more racks in spaced relation relative to one another. Chassis 526 may be configured to position the racks facing at least three different directions, e.g., six directions in the illustrated example. Wedge rack 536 (FIG. 7) is secured to chassis 526 such that chamber 536 is facing outward from the interior chamber defined by the back side of chamber 536 and the back side of other racks when secured to chassis 526. This may eliminate the need to reach the back side of the chamber (for maintenance, computing, networking, etc.), as opposed to existing rack cabinets which necessitate access to the back of the rack cabinets for operating some functions of the equipment, servicing, or securing the equipment. Existing rack cabinets are usually placed in single rows forming aisles between them to allow access to the back of the rack cabinets.

In some embodiments, chassis 526 includes a chamber brace 532 configured to connect to a leveling base 528 of chassis 526. Brace 532 is a multi-surface brace. Each surface is configured to receive a wedge rack. In some embodiments, brace 532 may be configured to fit within leveling base 528. In some cases, brace 532 may be configured to fit on top of leveling base 528. In some embodiments, brace 532 and leveling base 528 may be configured to be removably connected (screws for example). In some embodiments, brace 532 and leveling base 528 may be permanently connected (e.g., welded, or permanently glued together).

In some embodiments, chassis 526 may include baffles 530/534 configured for directing air for an efficient air flow within chamber 500 (e.g., for cooling, ventilation, heat exchange, etc.) In some cases, the baffles may make airflow more uniform into or out of the chamber. Different rack-mounted computing devices may obstruct air differently, potentially leading to areas of high flow and other areas of low flow. The low flow areas may not be adequately cooled. To mitigate this issue, the baffles may constrain airflow and, thereby, account for a substantial portion of the pressure drop between the interior and exterior of the chamber. As a result, it is expected that computing-device specific differences in the pressure drop will account for a smaller portion of the total pressure drop, thereby evening fluid flow. In some embodiments, the baffles may be in the form of vanes, panels, orifices, or other forms. In some embodiments, the baffles may be one or more of longitudinal, horizontal, or other type of baffles.

In some embodiments, baffles 530/534 may include baffles configured to vary airflow restriction vertically along the length of the interior chamber to reduce the likelihood of positive pressure developing in the downstream end of the interior chamber. Positive pressure on what is intended to be the downstream side of the rack, in some use cases, is undesirable, as it can cause hot air to flow back from the interior chamber towards some of the racks, heating rather than cooling computing equipment. For instance, from the bottom of the interior chamber to the top of the interior chamber, the amount of airflow restriction provided may progressively increase, e.g., from an unobstructed region along one quarter of the length, to a partially obstructed region spanning the next quarter of the length, to an even more obstructed region spanning the next quarter of the length, and finally to a fully obstructed portion for the final quarter. A variety of structures may be used to partially obstruct airflow. Examples include arrays of holes drilled in a plate (like in a hexagonal lattice), with hole size and density decreasing as airflow obstruction increases. In some embodiments, airflow restriction may vary smoothly from one end of the chamber to the other, or separate portions may be defined. In some embodiments a filter media of increasing density may vary the resistance to airflow. In some embodiments the varying impediments to flow may be placed at the outer radius of the chamber or intermediate between the inner chamber and outer surface.

Figure 7:
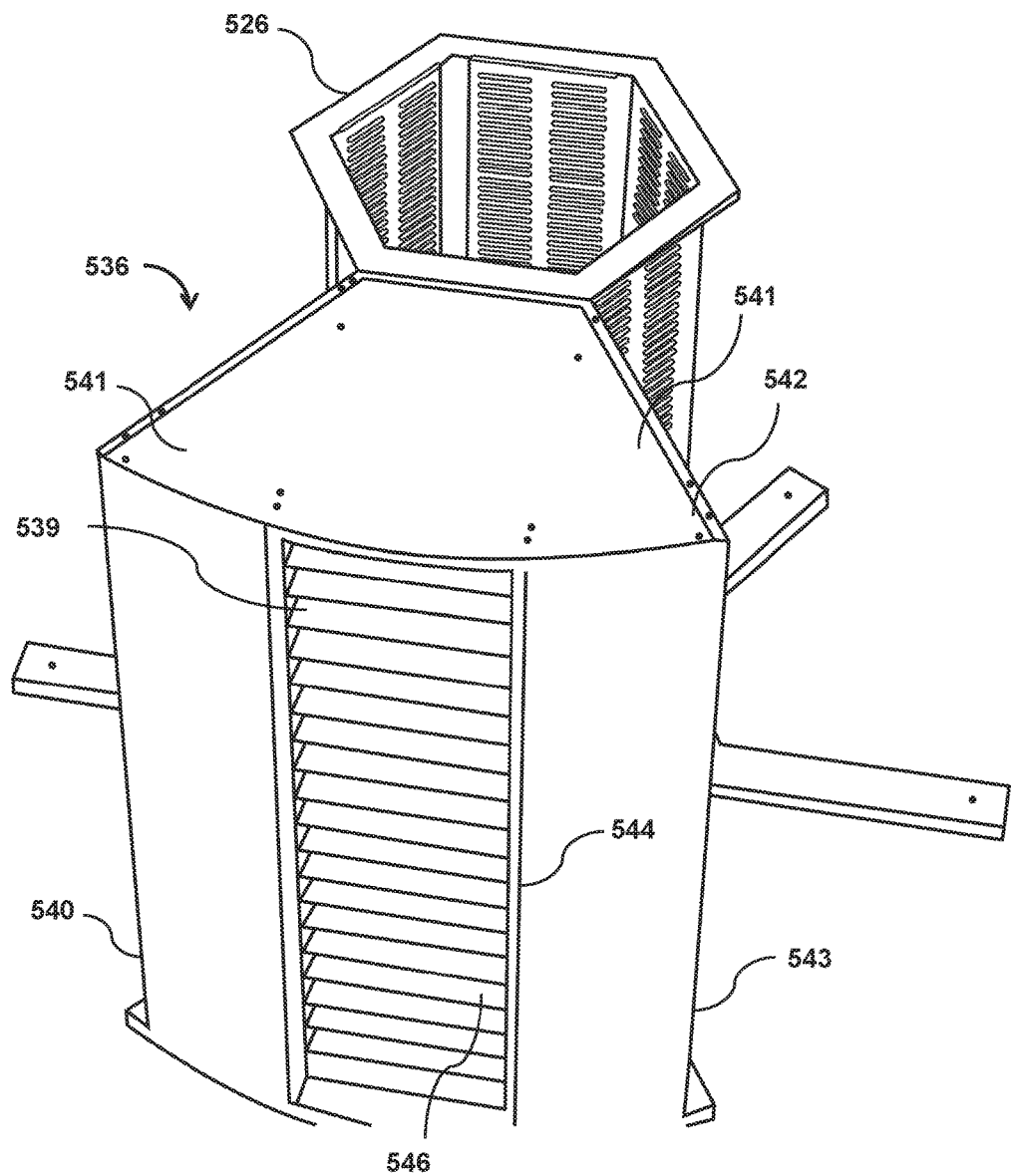
FIG. 7 illustrates a wedge rack of the cylindrical datacenter chamber of FIG. 1, in accordance with some embodiments.

FIG. 7 illustrates an example of a wedge rack 536 positioned on chassis 526. In this example, wedge rack 536 defines a generally wedge-shaped volume 541 along at least one side of the wedge rack. In some embodiments, the wedge rack comprises three articulating panels. A first panel 539 (not shown, but the element number identifies the area covered by the panel) may be configured to selectively provide access to a rack of computing devices 544, a second panel 540 configured to selectively provide access to a first wedge-shaped volume on one side of the rack of computing devices 544, and a third panel 543 configured to selectively provide access to a second wedge-shaped volume on a second side of the rack of computing devices. In some embodiments, computing devices may be disposed on equipment shelves 546. First panel 539 may provide front-side access (front side being the opposite side of a back side adjacent to the interior chamber) for compute, network, and storage interfaces for computing devices mounted in the racks. Wedge rack 536 may include wedge rack top cover 542 configured to fit on top of wedge 536. In some embodiments, top cover 542 may be removably connected to the top of wedge 536. In some cases, top cover 542 may be permanently connected to the top of wedge 536.

Figure 8:
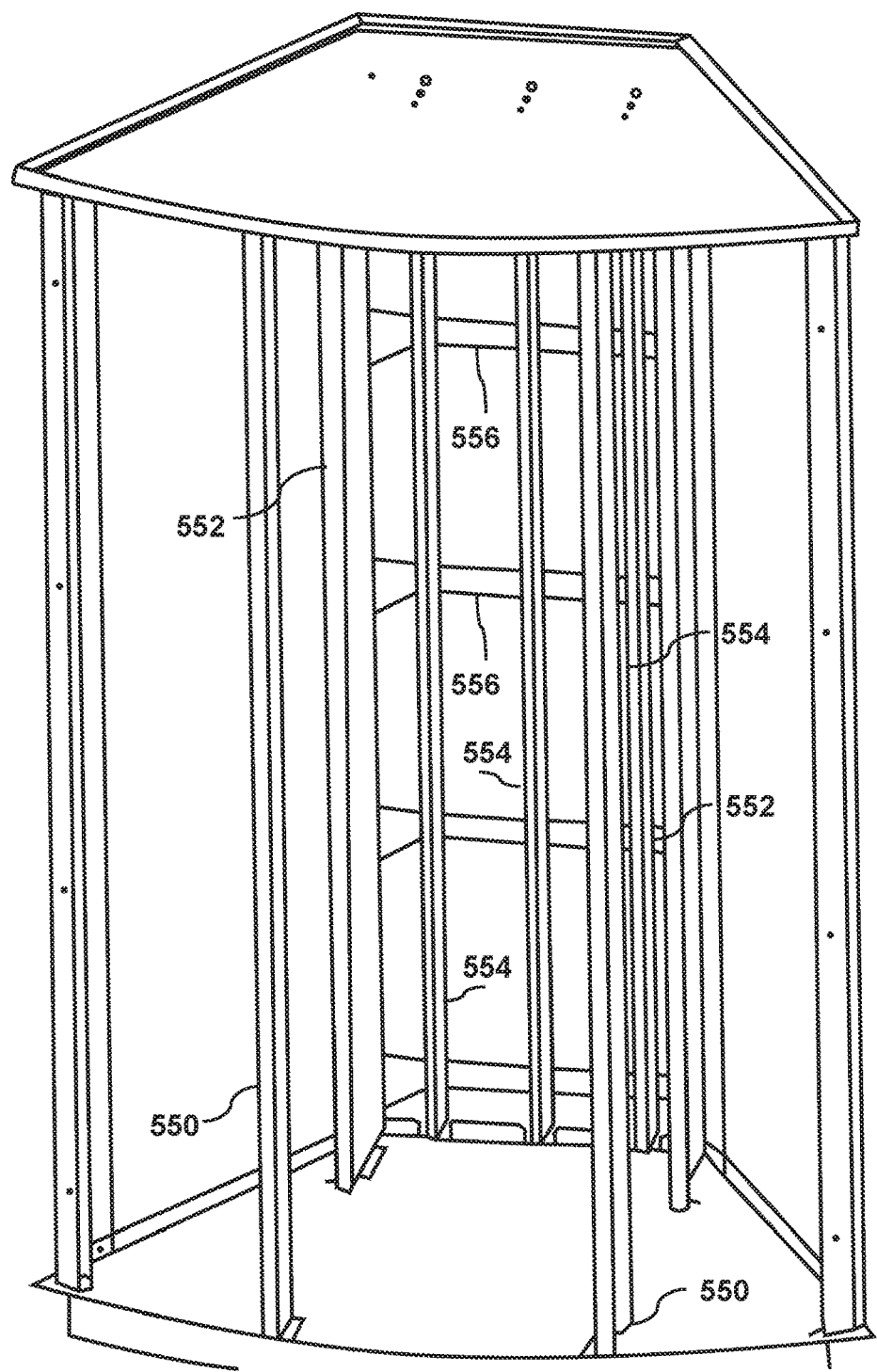
FIGS. 8-10 illustrate examples of components of the wedge rack of the cylindrical datacenter chamber of FIG. 1, in accordance with some embodiments.
Figure 9:
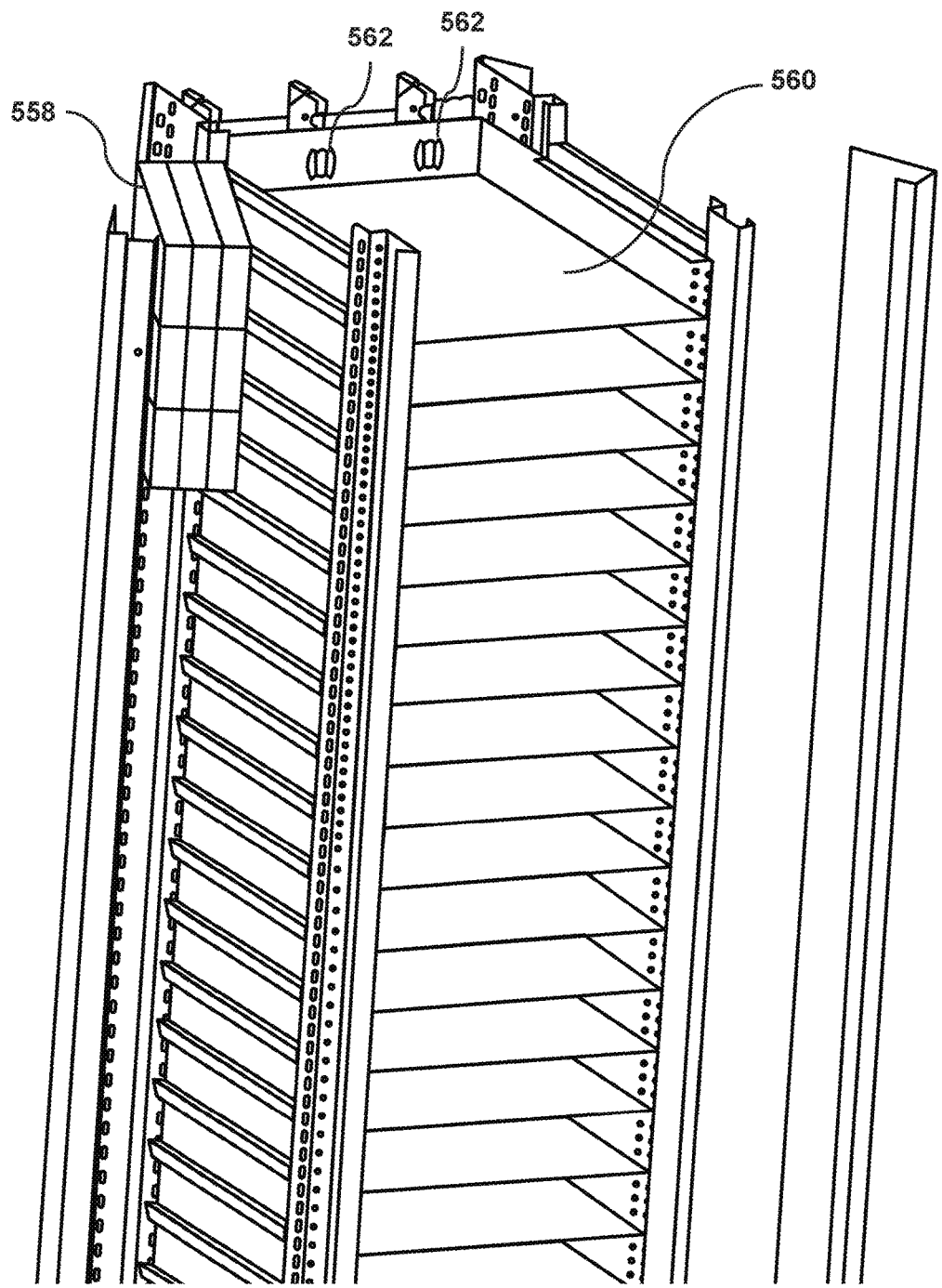
Figure 10:
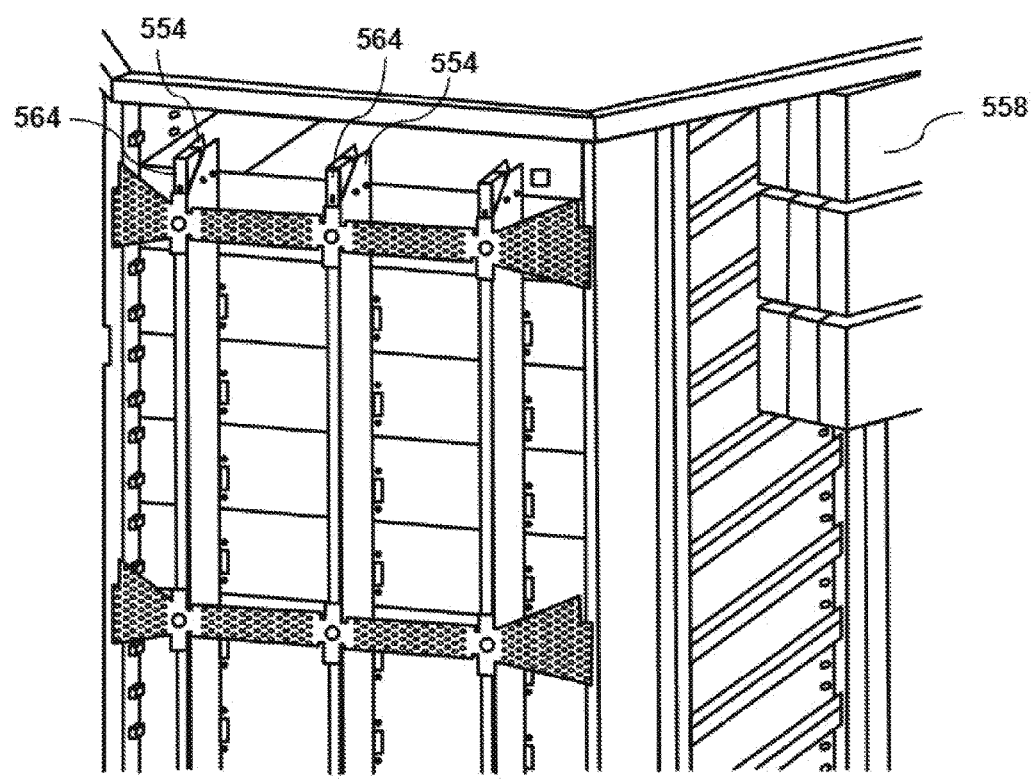
Figure 11:
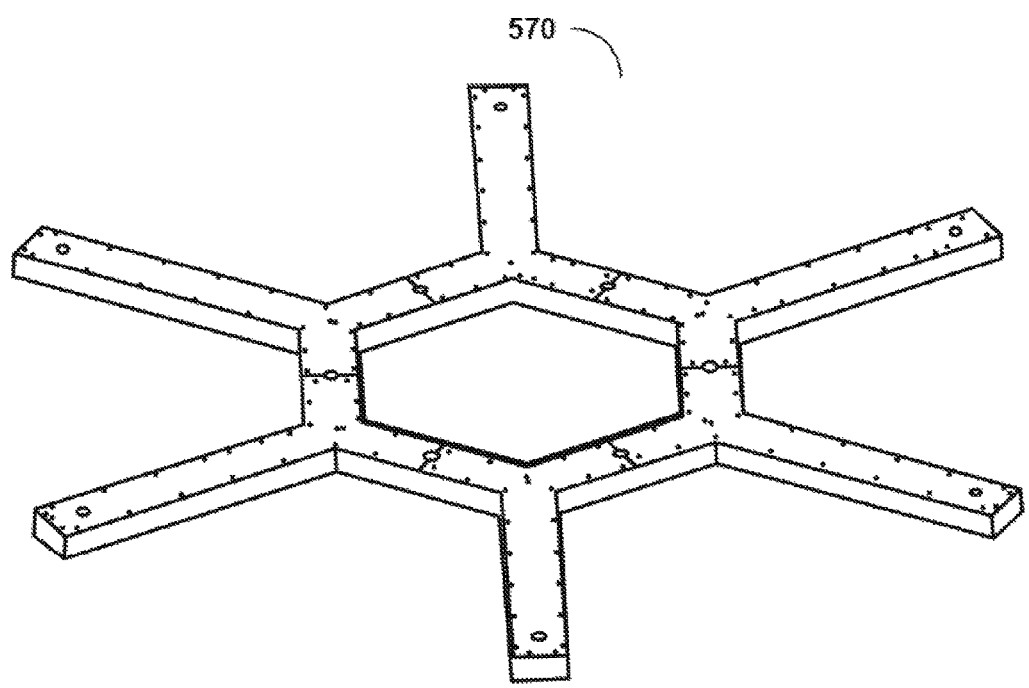
FIG. 11 illustrates a leveling base for the wedge racks of the cylindrical datacenter chamber of FIG. 1, in accordance with some embodiments.

FIGS. 8-10 illustrate examples of components of a wedge rack, in accordance with some embodiments. In some embodiments, wedge rack 536 includes a plurality of structural support elements configured to provide structural support and allow for heavy equipment mounting. For example, FIG. 8 shows rack front supports 550 located proximate an outer face of the wedge rack and extending vertically, rack rear support 552 located proximate to a back side of the wedge rack and extending vertically, and bus bar braces 556 extending horizontally and located proximate to a back side of the wedge rack adjacent the interior chamber coupled approximately perpendicular to rack rear support 552 and rack front support 550. A plurality of bus bars 554 may be disposed along the racks adjacent the interior chamber. Bus bar 554 may be connected to bus braces 556 (e.g., via screws).

The bus bars may be configured to distribute direct current (DC) power to at least some of the computing equipment by conducting electricity (e.g., direct current) within the racks, e.g., delivering power to rack mounted computing devices that establish electrical contact with the bus bars upon being slid into the rack. The bus bars may be in the form of a metallic strip or bar (e.g., copper, brass or aluminum), and the bus bars may be electrically isolated from the chamber chassis. In some embodiments, the bus bars may be of other shapes (e.g., flat strips, solid bars and rods, solid or hollow tubes, and braided wire). Some of these shapes allow heat to dissipate more efficiently due to their high surface area to cross-sectional area ratio. Hollow or flat shapes are prevalent in higher current applications. In some cases, the one or more bus bars may be enclosed in a bus duct. The material composition and cross-sectional size of the bus bar may determine the maximum amount of current that can be safely carried. In some embodiments, the bus bars may have insulators (564 of FIG. 10), or insulation may surround them in some cases to protect them from accidental contact. In some cases, bus bars may be enclosed in a metal housing, in the form of bus duct or busway, segregated-phase bus, or isolated-phase bus.

In some embodiments, chamber 500 may include a plurality of direct current (DC) bus bars for power distribution. Generally, rack-mounted computing equipment consumes DC power. Traditionally, in many cases each instance of equipment received alternative current (AC) power and converted the AC power to DC power with a dedicated power converter. This technique however can be expensive and generate additional heat near the computing equipment. Some embodiments may eliminate the need for the AC power converters by providing DC power. Or in some cases it can be expensive to power an AC voltage input power supply from the DC bus bar. In some embodiments, a bus bar power adapter may allow traditional AC voltage servers to be safely powered, and in some cases, controlled or monitored, via a DC power source.

In some embodiments, datacenter chamber 500 may include a backup power supply. In some cases, chamber 500 may include an integrated power infrastructure. For example, an uninterruptable power supply (UPS) that may be configured to provide uninterrupted power over some duration. In some embodiments, the power supply may be a battery-driven power supply (As shown in FIGS. 9-10 wedge rack 536 may include a rectifier or a battery module 558). For example, a higher-voltage direct current (DC) power source, such as a battery may provide electrical power that is converted into a lower voltage, higher current DC power source. In some embodiments, the battery may be based on any of a variety of different chemistries. Examples include lead-acid, nickel-metal hydride, lithium ion, and the like. In some embodiments, other power sources may be used, such as fuel cells, banks of capacitors, and the like. The transformation may be effected by a DC-DC converter, such as a 48-volt to 12-volt DC-DC converter that receives 48-volt DC power at given current and produces 12-volt DC power at a substantially higher current. In some embodiments, the several of the above UPSs may be placed in each rack. In some embodiments, each wedge of a rack may include a separate UPS, e.g., three or more UPSs for each wedge connected in parallel to increase current at a given voltage over that provided by a single UPS. Modular power supplies are expected to limit the scope of damage if any one UPS fails. In some embodiments, the UPS may be controlled remotely.

In some embodiments, datacenter chamber 500 includes a plurality of computing devices disposed in the racks. The computing devices may be disposed on equipment trays 560. In some cases trays 560 may have a plurality of openings on the back of the trays adjacent the inner chamber. The opening may be configured to facilitate connection of the equipment and bus bars. In some embodiments, the openings may include bus bar connectors (example 562 in FIG. 9). The computing devices may have stored thereon operating systems and user-applications (e.g., server applications, databases, load balancers, etc.)

In some embodiments, datacenter chamber 500 may include an integrated compute fabric configured to connect a plurality of computing devices within the chamber. The integrated compute fabric may be configured to connect the computing devices through interconnected nodes and links that look like a "fabric". The nodes may refer to processors, memory, or peripherals and the links may refer to functional connection between nodes. The integrated compute fabric may allow for high processing capabilities.

With some traditional systems, installations are difficult when racks are required to be positioned in relatively precise orientations in order to create a particular geometric shape or to direct airflow. To mitigate this issue, some embodiments use a modular and interlocking leveling base 570 (FIGS. 11-13) framework that serves to both level and to orient the racks into alignment, thus enabling the assembly of complex arrangements of racks with ease. That said, embodiments are not limited to systems that provide these benefits, as various independently useful techniques are described here, which is not to suggest that any other feature may not be omitted in some cases.

Figure 12:
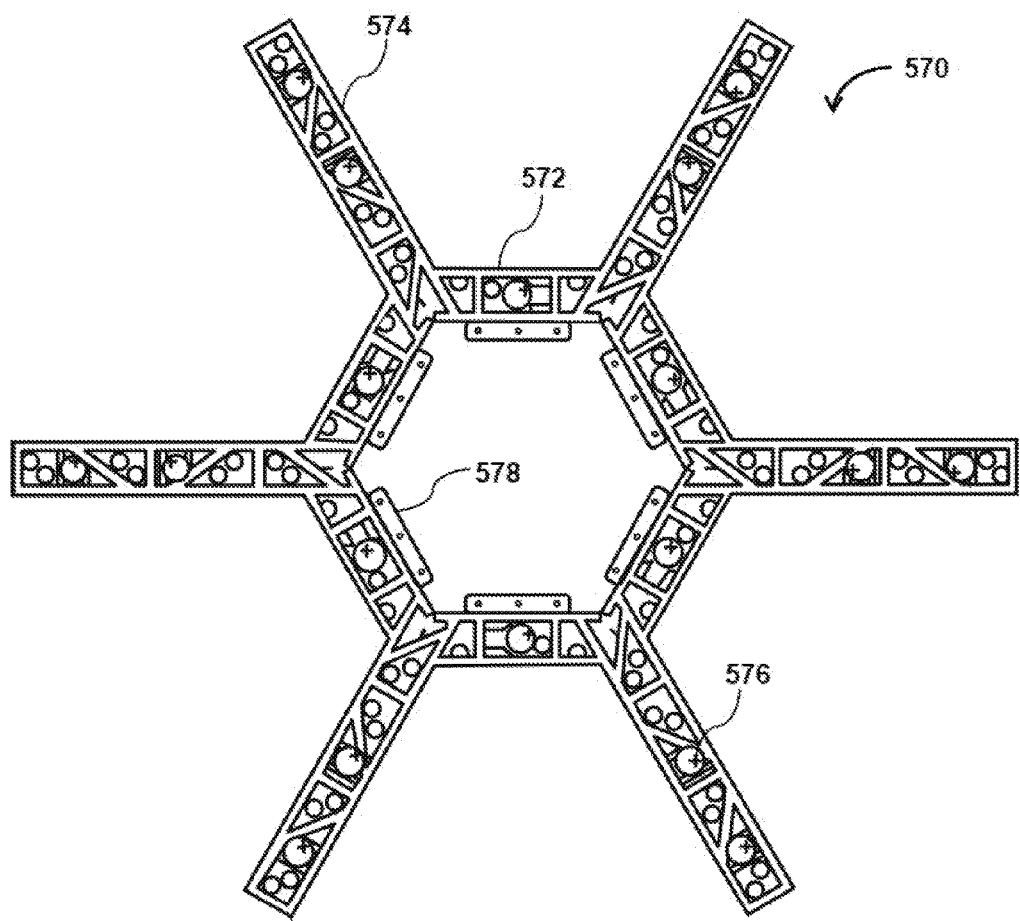
FIG. 12 is a bottom view of the leveling base of FIG. 11, in accordance with some embodiments.

In some embodiments, leveling base 570 includes a center piece (572 of FIG. 12) and a plurality of horizontally extending arms (574 of FIG. 12). Center piece 572 may be of hexagonal shape. Or in other cases, the leveling base may of triangular, square, pentagonal, hexagonal, heptagonal, octagonal, decagonal, dodecagonal, or other shapes. In some embodiments the leveling base is of the same shape as the base of chassis (described above). In some embodiments, the leveling base includes a plurality of modular sections configured to be connected together to form the leveling base (e.g., screws, rivets, etc.) This may help in shipping, installation and configuration of the leveling base. In some embodiments, the modular sections may be assembled on-site and then leveled to ensure even weight distribution across the floor. In some embodiments, leveling base 570 may be constructed of aluminum, steel, or a combination thereof to help keep the weight down. The leveling base may be bolted to the floor, using a plurality of bolting plates 578 (as shown in FIG. 12) located in the bottom side of the leveling base, to secure the structure in place to allow for installation and alignment of the racks. The bolting plates may be arranged such that they extend away from the leveling base towards the inner center section of the base.

In some embodiments, the bottom side of the leveling base includes a plurality of adjustable leveling feet 576 configured to level the base and, later when installed, the rest of the chamber. The adjustable leveling feet may be configured to be threaded in the leveling base to allow for adjusting the height of the leveling base and locking for the level of the base. Or other height-adjustable implements may be used, e.g., shims, wedges, hydraulic feet, ratchets, or interchangeable feet of different sizes. In some embodiments, each extending arm may include at least one adjustable leveling foot. In some cases, the leveling base may include a plurality of height-adjustable feet extending from the bottom of the base. In some cases, the height adjustable stands may be bolts threaded into a threaded interface of the base. The bolts extend downward to feet 576, the bolts being adjustable thereby adjusting the height of the feet. In some cases, before the racks are installed, the base may be leveled, so that the weight of the chamber does not interfere with leveling.

Figure 13:
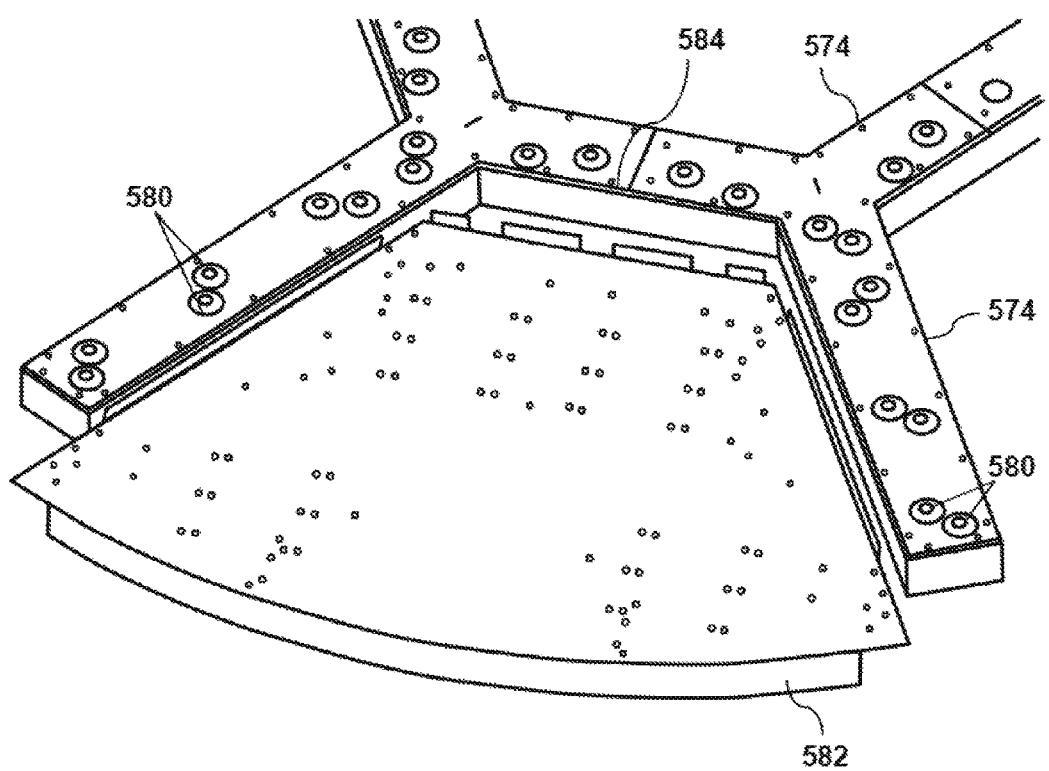
FIG. 13 is a view of a portion of the leveling base of FIG. 11, in accordance with some embodiments.

In some embodiments, as shown in FIG. 13, the upper side of the leveling base includes devices for reducing friction as a wedge-shaped rack is translated over the base. In this example, a plurality of ball bearings 580 located in the extending arms 574 and the center piece 572 of the leveling base 570. The ball bearings are configured to create a guide and support for the racks as they are lifted slightly and slide into place. In some embodiments, the ball bearings 580 include a steel ball seated in a socket. A portion of the ball may extend out of the socket and above the base, with the socket extending into the respective arm, so that less than half of the ball bearing extends above the top surface of the arm. In some cases, each ball bearing has a diameter of between one and three centimeters. In some embodiment, the socket may house a plurality of smaller bearings (e.g., between 2 and 5 millimeters) on which the exposed ball bearing rides to lower friction. Examples include an SP-30 ball transfer unit available from Ahcell of Taizhou, Jiangsu Province in China. In some embodiments, each extending arm may include eight ball bearings configured such that four ball bearings guide and support one bottom side of a rack and the other four ball bearings on the same arm are configured to guide and support one bottom side of an adjacent rack.

During installation of a wedge-rack, the wedge-rack may be translated (e.g., slid, rolled or carried) horizontally toward the interior chamber, between the respective arms receiving the unit. As the rack makes contact with the distal portion of the ball bearings extending upward from the arms, the bottom of the rack 582 may be lifted (in some cases by being slid against and up onto the ball bearings) and rolled on top of the ball bearing located on the arms located on each side of the bottom of the rack. Once on the ball bearing the bottom of the rack is pushed (with relatively little effort) such that the back side 584 of the bottom of the rack is on top of the ball bearing located on the center piece of the leveling base. As the rack is pushed backward a first force is generated translating the rack slightly upward, as the rack rolls onto the ball bearings. Then, as the rack rolls over the ball bearings, the rack may translate downward to sit on the leveling base, e.g., the bottom of the rack may include an indent to receive each ball bearings when in the proper position, thereby providing haptic feedback indicative of proper alignment.

Once in place, the bottom of the rack may be secured using an electronic latch, or a manual latch (e.g., a peg in a hole). In some embodiments, once the rack is in place a signal indicating that the rack is properly seated on the leveling arm may be generated (e.g., audible signal, visual signal, or other forms of signals). In some embodiments, a gasket sealer may be used to seal the racks side by side and to seal the back side of the rack to the chassis.

Alternatively, or additionally, the leveling base may include air-casters configured to secure each of the racks to the leveling base. In some embodiments, air-casters may be created in the assembled leveling base such that they coincide with mating structures on the bottom side of the rack. The air-casters create a guide for the racks as they are lifted slightly and slid into place. Once in position, the rack is lowered onto the base and settles into the air-casters, which is expected to help with proper alignment. In some embodiments, other structures may reduce friction, e.g., Teflon™ bushings, bearings on the bottom of the rack, wheels on the top of the base or bottom of the rack, etc.

In some embodiments, the above-described rack-mounted computer assemblies (or other rack designs) may include locational sensors, such as the locational sensors described below with reference to FIGS. 14-15. In some embodiments, the locational sensors may be configured to provide location data. In some case, additional information may be provided along with the location data. For example, identification (e.g., for quality assurance to indicate the device present is correct), rack/rerack counts, whether a rack location is tagged to be monitored, whether a rack location has ever been exposed to an environmentally hostile condition (e.g., a fire or extreme temperature condition, etc.), identifying the network switch port corresponding to a device, and other information.

Figure 14:
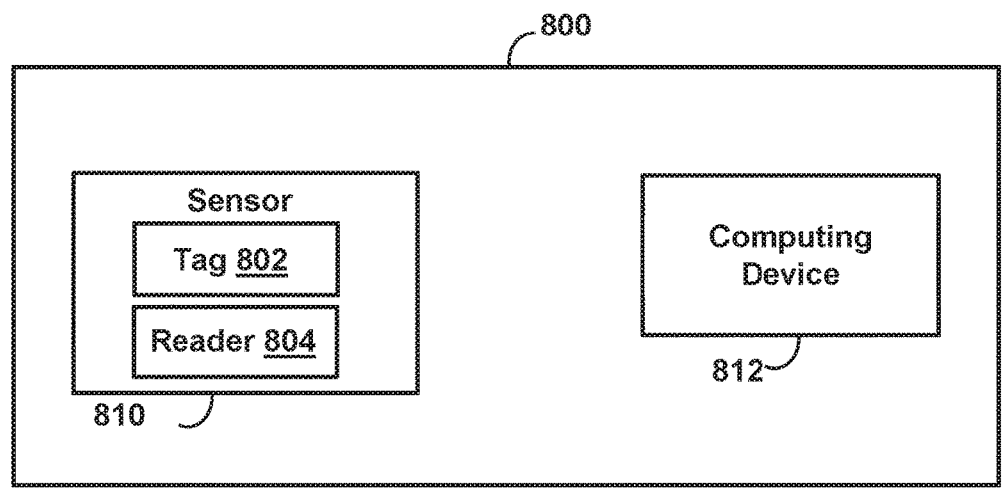
FIG. 14 illustrates a block diagram of an example of a server rack configured for computing device localization, in accordance with some embodiments.

FIG. 14 illustrates a rack 800 having a plurality of computing devices 812 and sensors 810 that may mitigate some of the above-described issues with traditional localization techniques, as well as, or in the alternative, provide other benefits described below. In some cases, rack 800 may be similar to one or more of the above-described racks (or collections of racks, like a chamber). In other cases, rack 800 may be a traditional rack with more conventional arrangements of rack computing devices 812, for example in more traditional architectures with linear rows of rack-mounted computing device receptacles on either side of a hot aisle.

In some embodiments, sensors 810 are location sensors configured to provide information related to the location of rack 800 in a data center. Location sensors need not directly signal location and may signal a value indexed to a location in a database. For example, sensors 810 may provide unique identifiers associated in memory with a latitude, longitude, and altitude (e.g., height, or floor in a multi-floor datacenter) information related to rack 800. In some cases, sensors 810 may provide information related to equipment location in rack 800 (e.g., computing device 812). Equipment location in rack 800 may include vertical position relative to a top and/or bottom of the rack, horizontal position relative to left and/or right rails of the rack, and depth position relative to the front and/or rear rails of the rack. In some cases, sensors 810 may provide information related to location of a rack and computing equipment with the rack. For example, for a given equipment, vertical, horizontal and depth position in a rack are provided along with the latitude, longitude, and altitude of the rack within the data center are also provided. In some embodiments, sensors 810 may provide information related to multiple racks and multiple equipment within the racks in a data center.

In some embodiments, sensors 810 may be installed in various locations (e.g., back of computing equipment 812, on the chassis of the computing equipment adaptor (described above), on the rails of rack 800, or any other location within a rack, a chamber (described above), or a data center. In some cases, each receptacle (e.g., a "U") of a rack may have a respective sensor, e.g., with a wireless transmitter that transmits a unique identifier and a wireless receiver that receives the wireless signal. Sensors 810 may be attached using various connections (e.g., wires, cable ties, screws, rivets, adhesives, Epoxy resins, etc.) In some embodiments, sensors 810 may be embedded in one or more components of rack 800, or computing equipment 812. In some cases, sensors 810 may be positioned on each rack U of the above-described racks, e.g., at a rear portion. In some embodiments, sensors 810 may be spaced about 48 millimeters apart (which corresponds to the OpenU rack height), in other cases, sensors 810 may be spaced about 44.45 millimeters or 1.75 inches apart, which corresponds to a standard rack height. That said, this is not to be construed as limiting as other spacing between sensors 810 may be considered, which is not to suggest that any other description is limiting.

In some embodiments, a sensor 810 may include a tag 802. Tag 802 may be an electronic device containing information (e.g., identifying information (ID)) that can be accessed by a reader 804 and wirelessly conveyed to a user, a rack control unit, or a central control unit for the datacenter. Tag 802 may be (or may be embedded in) a sticker, a barcode, a label, or a smart label (that transfers data, or launches an application in a reader when it senses the reader in proximity). Along with the identifying information, other information provided by sensor 810 (e.g., location, condition, temperature, humidity, moisture, motion, etc.) may be conveyed along with the ID. In some cases, tag 802 may be attached to rack 800 as described above, and reader 804 may be attached to computing device 812, or vice versa.

The spacing (and wireless broadcast range) between tag 802 and reader 804 may be relatively short for example equal to or less than about three quarters of an inch to prevent reading multiple tags from adjacent receptacles of a rack, in some embodiments. In some cases, the range between tag 802 and reader 804 may be equal or less than eight inches. In other cases, the range between tag 802 and reader 804 may be up to 4000 inches. In some embodiments, tag reader 804 may be mounted at rear of the chassis of the adaptor described above with a wire that places the reader in communication with the the powerline communication modem. This is expected to allow for the tag to be found even if the server is off. This is advantageous because it does not require mechanical/electrical interface between the tag and the reader (mechanical/electrical contact tend to brake or corrode). That said, other embodiments may use such electrical contacts in conjunction with the other inventive aspects described herein.

In some embodiments, tag 802 includes an integrated circuit (e.g., including a modem, a memory, processor, and power storage, etc.) for storing and processing information. In some embodiments, tag 802 may include a local power source (e.g., battery) and may transmit its ID (or other information) periodically without being "interrogated" by a reader 804 or in some instances may transmit only in the presence of a reader 804, or only if interrogated by the reader. In some cases, the reader may activate the tag (e.g., power the sensor for a reading) only when asked by reader. In some instances, tag 802 and reader 804 communicate by alternately generating their own fields (e.g., one deactivates its field while waiting from data from the other). In other cases, tag 802 does not include a power source, and instead uses radio energy transmitted by reader 804 through antennas. In some embodiments, tag 802 includes an antenna for receiving and transmitting signals and for collecting energy to turn the tag on. In some cases, the antennae use magnetic or electromagnetic coupling between a tag 802 and reader 804 antennas for power transferring between reader 804 and tag 802. For example, reader 804 antennae may convert electrical current into electromagnetic waves that are then radiated into space where they can be received by tag 802 antennae and converted back to electrical current. In some instances, tag 802 (or reader 804) may include more than one antenna for better communication with reader 804 (or tag 802).

In some embodiments, tag 802 may include read-only factory programmed data (e.g., a tag identifier, serial number, a unique tracking identifier, etc.) In some embodiments, tag 802 may include an area of tag memory that is writeable. The writable data may include name of rack, name of data center, address, serial numbers, etc. In some embodiments, writing or retrieving the data from the tag may be done remotely via a rack control unit or central control unit as described below.

In some embodiments, reader 804 may be a two-way radio transmitter-receiver that provides connection between tag 802 data and local or central control unit or other applications by interrogating tag 802. In some cases, tag reader 804 may include control and application software (e.g., middleware) for connecting reader with the applications they support by sending commands to the reader and receiving tag data from the reader. In some embodiments, reader 804 may communicate with several tags within its range simultaneously to capture data from the different tags. Reader 804 may be attached to computing device 812 (e.g., mounted to or embedded), rear of the chassis of the adaptor described above, or in other locations. In some cases, reader 804 may be a mobile reader. For example, the mobile reader may be mounted on a hand held device, on a mobile cart, a mobile barcode scanner, etc.

In some embodiments, tag reader 804 may include an antenna for receiving and transmitting signals. In other embodiments, tag reader 804 may use an off-the shelf antennae, or in other cases, a printed circuit board (PCB) trace antenna may be used as an antenna. In some cases, antennas used in tag reader 804 (or tag 802) may be linear-polarized antennas configured to radiate linear electric fields with long ranges, and high levels of power allowing their signals to penetrate through different materials (e.g., to read the tags). These types of antennas are sensitive to orientation of the tag (or reader). In some cases, antennas used in tag reader 804 (or tag 802) may be circular-polarized antennas configured to radiate circular electric fields. These types of antennas are less sensitive to orientation. This is not to be construed limiting, as other types of antennas may be used, which is not to suggest that any other description is limiting.

Different types of sensors may be used. For example, close-range radio-frequency identification (RFID) or near-field communicating (NFC) sensors may be used in accordance with some embodiments. In some cases, optical sensors may be used. For example, an optical tag (e.g., a bar code or QR code) may communicate information to the reader by reflecting the read request by reflecting a spatially modulated version of the incoming signal optical reader, which extracts the information by analyzing the pattern. In other cases, sensor 810 may include a barcode containing information and a barcode scanner that reads and decodes the barcode information locally or transfers the information to an application program for decoding. Other types of sensors may be considered.

In some embodiments, more centralized components, like a control unit for a rack or for a datacenter (e.g., remote management controller acting as the rack level control unit), may take inventory of the presence and location of tagged devices. For instance, an application program interface (API) request to such a control unit may prompt the control unit to scan for present devices (e.g., devices available on a DC power bus). In some embodiments, a control bus, such as a dual-purpose DC power and control bus coupled to a powerline modem on a rack, may be accessed by the centralized control unit to scan for tags. In some cases, such scans may be performed periodically, e.g., less than once an hour or once a day, or more frequently. In some embodiments, control units for each rack or subset of a datacenter may scan different powerline networks, with distinct address spaces, e.g., concurrently, to expedite scans in datacenters with relatively large numbers of tagged servers, for instance, in separate powerline networks for each rack. (Such scans may also interrogate various sensors, or tags associated with sensors, like humidity, air pressure, vibration, air flow, noise, particulate matter.) In some cases, a shared physical media of each rack-mounted device, like a DC power bus for a rack, may form the network over which the scan is implemented. FIG. 15 illustrates an example of a rack 800 including a sensor 810 in accordance with some embodiments. Sensor 810 includes a tag 802 and a reader 804 as described above. In some cases, tag 802 may be may be located on the rack and reader 804 may be located on computing devices 812 in the rack 800. Additionally, and alternatively, in some cases reader 804 may be located on the rack and tag 802 may be located on computing devices 812 in the rack 800.

In some cases, rack 800 may include a rack control unit 818 coupled via a power bus 814 (e.g., a DC power bus) to powerline modems on each rack-mounted device (e.g., server 812). The rack control unit may interrogate the available devices to determine location, capabilities, presence, and sensor readings, e.g., periodically. In some cases, the rack control unit 818 may exercise local control and monitoring over the operation of computing devices 812 in the rack 800. For example, rack control unit 818 may monitor the operation and presence of rack computing units and, in some cases, components of those rack computing units. In some cases, rack 800 may include multiple control units 818 configured to monitor, interrogate or receive sensing information from different sensors on rack 800 or computing devices 812 on the rack. In some cases, the control unit may be a central unit (e.g., for multiple racks, an entire chamber, an entire floor, or an entire data center) that may be configured to monitor, interrogate or receive sensing information from different sensors with monitoring data being sent back to a central monitoring station.

In some embodiments, the rack control unit 818 may be configured to periodically request, the status of various sensors 810 such as location sensors, temperature sensors, vibration sensors, particulate sensors, fan speed sensors, airflow sensors, humidity sensors, air pressure sensors, noise sensors, and the like. In some embodiments, rack control unit 818 may compare the reported values to a threshold and raise or log various alarms, for example, to bring a condition to the attention of an administrator. Similarly, in some cases, rack control unit 818 may implement, by commands, various changes in rack 800, or computing device 812, or other computing devices on rack 800 in response to information received from sensors 810. Examples include instructing rack computing device 812 to boot up or turn off, update a bios, change a setting in persistent flash memory (in some cases bypassing the bios), update or report a firmware version, change a register value in a peripheral, and initiating and executing a remote terminal session.

In the illustrated embodiment, rack control unit 818 includes a rack controller 824, and a powerline modem 828. In some embodiments, the rack controller 824 may implement the logical functions described above, for example, for monitoring the rack 800 and the rack computing devices 812 (and/or other racks and other computing devices), and controlling the rack computing device in response to information from sensor(s) 810. For example, in some embodiments, the rack controller 824 may execute routines that control, engage, and disengage various thermal control units, such as fans or adjustable airflow restrictors, responsive to temperature sensors indicating an imbalance in airflow or positive pressure in an exhaust region. In some embodiments, the rack controller 824 is an application executing on a distinct computing device having a processor, memory, and an operating system. In some embodiments, the rack controller 824 includes a REST-based web server interface operative to receive instructions and provide responses according to a RESTful application program interface (API).

In some embodiments, rack 800 may include a bus bar power adapter 830 configured to provide power (e.g., DC power) to the rack mounted computing device 812. As described above, reader 804 may be installed on the bus bar power adapter 830. Bus bar power adapter 830 may include in some cases, a powerline modem 834 including a microcontroller 836 that may be configured to retrieve sensing information from reader 804 and send this information across the powerline. Several protocols may be used to retrieve or send information (e.g., Ethernet, rs485, zigBee, etc.) Such protocols may be implemented to retrieve or send information on DC power bus 814 or other physical media, e.g., wireless, or protocol-specific cabling in some cases. In some cases, the modem 834 includes a protocol-specific network adapter with a media access controller and transceiver (e.g., wired or a radio) configured to execute routines by which access to the media is arbitrated and information is conveyed in accordance with these protocols. In some embodiments, the microcontroller 836 is operative to receive signals from the powerline modem 834 and take responsive action. For example, the microcontroller 836 may receive commands from powerline modem 834 and implement those commands. In some cases, the commands may include accessing, configuration, or polling reader 804, and/or tag 802 to provide information that describes what sensors are available, their type, or their location, etc. Microcontroller 836 may implement some of the commands, for example, by querying or otherwise polling sensor(s) 810 to monitor things like location, voltage in, voltage out, current, resources being used by the computing device 812 (e.g., power usage), or environmental conditions, like temperature, vibrations, airflow, particulates, humidity, electromagnetic radiation, and the like.

In some embodiments, microcontroller 836 may receive commands from the rack control unit 818 and implement those commands, for example, by querying or otherwise polling sensors 810, to monitor things like resources being used by the computing device 812 (e.g. processor usage or memory usage), or environmental conditions, like temperature, vibrations, airflow, particulates, humidity, electromagnetic radiation, and the like. In some embodiments, the microcontroller 836 may be operative to drive various signals into the computing device 812 that reconfigure the computing device 812, monitor the computing device 812, or control the computing device 812. Examples include sending signals onto a system management bus or other bus of the computing device 812 that cause the computing device 812 to turn on, turn off, change a setting accessible via a BIOS (in some cases without engaging the BIOS and writing directly to flash memory), reconfiguring various settings, like clock speed or register settings for peripheral devices. In some embodiments, data may be read off sensor (s) 810 (e.g., off tag 802, or reader 804) and stored in the computing device 812, or in the microcontroller 836. The data may be updated each time the computing device 812 is pushed into a new location.

In some embodiments, additional space in the EEPROMs (or other registers associated with powerline modem 828 or computing device 812) may obtain and store other information beyond an address. For instance, each rack-mounted device may include a scanner (like an RFID, near-field communicating (NFC), or optical barcode scanner), and technicians working on the device may scan a badge to create a record in memory on the device indicating an identifier of the technicians that have serviced the device. In some cases, the microcontroller 836 may compare such an identifier to a list of permitted technicians, or determine that such a scan occurred, before disengaging a mechanical lock, like a solenoid holding a pin in a hole of the rack, to release the rack-mounted device before it is accessed. Or in some cases, permissible rack locations may be stored in memory of the EEPROM, like a whitelist or black list of permissible rack locations. The microcontroller 836 may compare a sensed location to the set of permissible locations and indicate a mismatch to rack-control unit 818. In some cases, the microcontroller 836 may cause a visual indicator, like a light emitting diode on a device or illumination strip 518, to illuminate to indicate compliance with, or a mismatch with respect to, a whitelist or black list of permissible rack locations. In some cases, the microcontroller 836 may write a value to the EEPROM in response to an environmental sensor threshold being exceeded, like if the device was exposed to heat in a particular range for more than a threshold amount of time, or a degree of particular readings exceeding a threshold. These values may be read later to troubleshoot equipment. In some embodiments, the EEPROM might list network port switches corresponding to the device, and these values may be accessed by the microcontroller 836 and CPU to ensure that a device is plugged into the correct port, which can help with cabling or network management.

Figure 15:
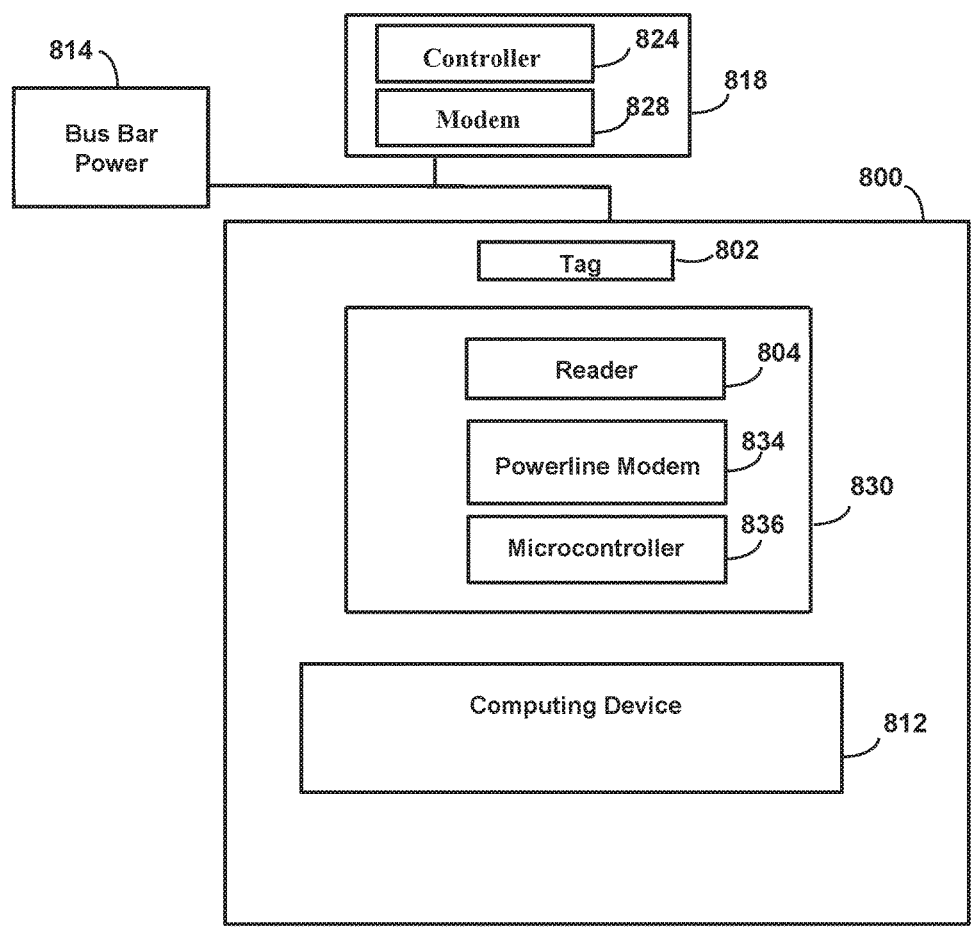
FIG. 15 illustrate a block diagram of an example of a server rack configured for computing device localization in accordance with some embodiments.

The embodiments of FIG. 15 is not to be construed limiting, or are any other embodiments. A datacenter may have a plurality of racks, each rack having a rack control unit coupled via a DC powerline bus to powerline modems on each rack-mounted device (e.g., server), and the rack control unit may interrogate the available devices to determine location, capabilities, and sensor readings, e.g., periodically.

In some embodiments, rack receptacles may include rails or shelves by which a server is slid backward into a rack. In some embodiments, the server may make electrical contact with the DC bus-bars described above near the end of being slid back into the rack, e.g., via blind mating. In some embodiments, this connection may power a wireless receiver on the server (e.g., mounted to the server even when the server is not installed in the rack). In some embodiments, as a result of the server being slid into the receptacle, the wireless receiver may be brought into alignment and broadcast range of one of a regularly spaced array of wireless transmitters on the rack (e.g., passive RFID tags or LEDs configured to emit an optical code in a pattern of flashes sensed by a light sensor on the server).

Some embodiments may use rack location information for data center rows to determine location by building, aisle, chamber, rack and server. Some embodiments may tag power drops, so that a unique identifier of a power drop is read when a computing device is connected to the power drop. Some embodiments may aggregate data associating computing devices with power drops, allowing the operator to know what breaker is on what rack. In some cases, the power drop location sensors are implemented in the power backplane area, in the top of rack switch, or at various rack controller interfaces. Using this information, some embodiments may create a user interface map showing the load on breakers. Some embodiments may also present visualizations for power allocation on breakers with real-time data, and some embodiments may identify runs that are underutilized based on this data. Based on this data, some embodiments may adjust load balancing in or between data centers.

Figure 16:
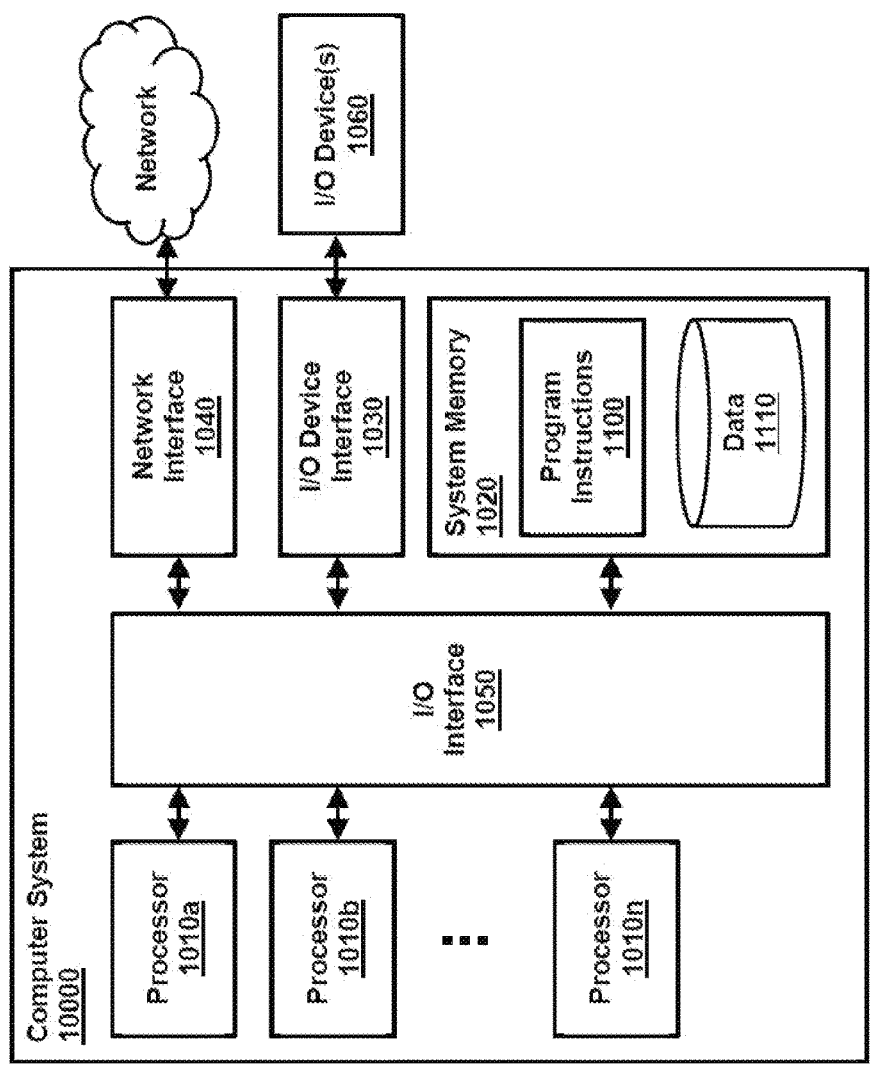
FIG. 16 illustrates components of a computing device that may be disposed and interconnected in the cylindrical datacenter chamber of FIG. 1.

FIG. 16 is a diagram that illustrates an exemplary computing system 1000 in accordance with embodiments of the present technique. In some cases, each U in each rack of the above-described chamber may house one or more of these systems 1000. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010*a*-1010*n*) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010*a*), or a multi-processor system including any number of suitable processors (e.g., 1010*a*-1010*n*). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device or a plurality of memory devices (e.g., distributed memory devices).

I/O interface 1050 may be configured to coordinate I/O traffic between processors 1010a-1010n, system memory 1020, network interface 1040, I/O devices 1060, or other peripheral devices. I/O interface 1050 may perform protocol, timing, or other data transformations to convert data signals from one component (e.g., system memory 1020) into a format suitable for use by another component (e.g., processors 1010a-1010n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present invention may be practiced with other computer system configurations.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims. Further modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, and certain features of the invention may be utilized independently, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present techniques will be better understood with reference to the following enumerated embodiments:

1. A method of localizing rack-mounted computing devices, the method comprising: receiving, with a direct current (DC) power bus configured to power the rack-mounted computing device, a request from a control unit for a rack computing device location; generating, with a sensor, output signals conveying information related to a location of the rack-mounted computing device; and sending, with the direct current (DC) power bus, location information of the rack-mounted computing device.
2. The method of embodiment 1, wherein the location information of the rack-mounted computing device includes latitude, longitude, or altitude.
3. The method of any of embodiments 1-2, wherein the information related to the location rack-mounted computing device includes vertical position, horizontal position, or depth position relative to the rack.
4. The method of any of embodiments 1-3, further comprising sending, with the direct current (DC) power bus, identification information (ID) of the rack-mounted computing device concurrent with the location information.
5. The method of any of embodiments 1-4, further comprising sending, with the direct current (DC) power bus, additional sensing information concurrent with the location information, wherein the additional sensing information includes presence, condition, state, motion, or environmental information.
6. The method of any of embodiments 1-5, wherein the location information is sent with the direct current (DC) power bus each time the computing device is placed into a new location.
7. The method of any of embodiments 1-6, further comprising triggering an alert in response to not receiving location information of the computing device.
8. The method of any of embodiments 1-7, further comprising triggering an alert in response to receiving location information indicative of the computing device being in a wrong location.
9. The method of any of embodiments 1-8, wherein the sensor comprises a tag configured to provide location information of the rack-mounted computing device and a tag reader configured to obtain the location information from the tag and send the location information to the control unit.
10. The method of embodiment 9, wherein the tag is located on the rack, and wherein the tag reader is located on the rack-mounted computing device.
11. The method of any of embodiments 9-10, wherein the tag is located on the rack, and wherein the tag reader is a mobile reader.

12. The method of any of embodiments 9-11, wherein the tag is a barcode and the tag reader is barcode scanner.

13. The method of any of embodiments 1-9, wherein the sensor is a radio-frequency identification (RFID) sensor comprising a RFID tag and a RFID tag reader.

14. The method of any of embodiments 1-9, wherein the sensor is a near-field communications (NFC) sensor.

15. A method of localizing rack-mounted computing devices, the method comprising placing a tag comprising identification information on a rack; placing a tag reader on a rack-mounted computing device; receiving, with a direct current (DC) power bus configured to power the rack-mounted computing device, a request from a control unit for a rack computing device location; generating, with the tag reader, information related to a location of the rack-mounted computing device; and sending, with the direct current (DC) power bus, the location information of the rack-mounted computing device.

16. The method of embodiments 1-9, wherein the rack-mounted computing device is connected to a power drop, the method further comprising sending, a unique identifier of the power drop indicating the location of the rack computing device.

17. The method of embodiment 16, wherein the unique identifier of the power drop is sent each time the computing device is connected to the power drop.

18. The method of embodiments 16-17, further comprising: identifying power allocation within a plurality of racks, the plurality of racks including the rack, and wherein the identifying includes user interface visualization of the power allocation.

19. The method of embodiments 1-9, further comprising: sensing with a tag reader a signal transmitted by a tag, wherein the tag or the tag reader comprises a persistent flash memory to store sensing information, and wherein the sensing information includes rack count.

20. A system, comprising a rack configured to hold a plurality of rack-mounted computing devices comprising a rack-mounted computing device; and a sensor tag configured to provide location information of the rack-mounted computing device; a direct current (DC) power bus configured to power operation of the rack-mounted computing device; a rack controller having a processor, a memory, and a powerline modem operative to send commands to, and receive data from the rack-mounted computing device via the DC power bus; and a power adapter connecting the rack-mounted computing device to the DC power bus, the power adapter comprising a powerline modem; a microcontroller operative to execute commands sent by the rack controller, the commands including requests for location of the rack-mounted computing device; and a tag reader configured to obtain location information of the rack-mounted computing device from the sensor tag and provide the location information to the microcontroller.

21. The system of embodiment 20, wherein the control unit is configured to send location requests periodically.

22. The system of any of embodiments 20-21, comprising a plurality of rack-mounted computing devices.

23. The system of any of embodiments 20-22, wherein each of the rack-mounted computing devices have memory storing instructions of an operating system and an application configured to exchange location information via the DC power bus.

24. The system of any of embodiments 20-23, wherein location information of the rack-mounted computing devices is transmitted via an Ethernet control network or data network and each of the rack-mounted computing devices have memory storing instructions of an operating system and an application configured to exchange location information via the Ethernet control network or data network.

25. The system of any of embodiments 20-24 comprising a plurality of racks each comprising a plurality of rack-mounted computing devices.

26. The method of embodiments 1-9, further comprising: sending, with an Ethernet control network, identification information (ID) of the rack-mounted computing device with the location information.

27. The method of embodiments 1-9, further comprising: sending, with an Ethernet control network, additional sensing information with the location information, wherein the additional sensing information includes presence, condition, state, motion, or environmental information.

28. The method of embodiments 1-9, wherein the location information is sent with an Ethernet control network each time the computing device is placed into a new location.

29. A method of localizing rack-mounted computing devices, the method comprising placing a tag comprising identification information on a rack; placing a tag reader on a rack-mounted computing device; receiving, with an Ethernet control network or data network, a request from a control unit for a rack computing device location; generating, with the tag reader, information related to a location of the rack-mounted computing device; and sending, with the Ethernet control network or data network, the location information of the rack-mounted computing device.

What is claimed is:

1. A method of localizing rack-mounted computing devices, the method comprising:
    receiving a request for a rack computing device location, the rack computing device being mounted in a rack comprising at least one blind mate power bus;
    wirelessly sensing, by a tag reader coupled to a blind mate power adaptor of the rack computing device, a value indicative of the location of the rack computing device, the reader configured to perform operations comprising:
        sensing, based on physical proximity between a tag and the tag reader, the value of the tag, the proximity being caused by the rack computing device being mounted in one of a plurality of receptacles in the rack, each of the receptacles being associated with a different tag, each different tag mounted to the rack independent of the rack computing device and encoding a different value indicative of a different location within the rack; and
        generating, based on the wirelessly sensed value of the tag, location information related to the location of the rack computing device mounted in the rack; and
    transmitting a signal conveying the location information via the blind mate power adaptor of the rack computing device, the blind mate power adaptor being coupled to a blind mate power bus of the rack.

2. The method of claim 1, wherein the location information includes latitude, longitude, or altitude.

3. The method of claim 1, wherein the location information includes vertical position, horizontal position, or depth position relative to the rack.

4. The method of claim 1, further comprising:
    sending, with a direct current (DC) power bus, identification information (ID) of the rack-mounted computing device with the location information.

5. The method of claim 1, further comprising:
sending, with a direct current (DC) power bus, additional sensing information with the location information, wherein the additional sensing information includes presence, condition, state, motion, or environmental information.

6. The method of claim 1, further comprising:
wirelessly sensing, by the tag reader coupled to the blind mate power adaptor of the rack computing device in response to a placement of the rack computing device in a different one of the plurality of receptacles in the rack, a different value indicative of a different location of the rack computing device;
sensing, by the tag reader, based on physical proximity between a different tag corresponding to the different receptacle and the tag reader, the different value of the different tag;
generating, based on the wirelessly sensed different value, second location information related to the different location of the rack computing device within the rack; and
transmitting a second signal conveying the second location information via the blind mate power adaptor coupled to a blind mate power bus of the rack, wherein:
the first signal conveying the first location information and the second signal conveying the second location information are transmitted based in part on the blind mate coupling of the blind mate power adaptor of the rack computing device with an energized blind mate power bus of the rack, the blind mate power bus providing power to the blind mate power adaptor and the tag reader regardless of whether the rack computing device is in a powered on state.

7. The method of claim 1, further comprising:
triggering an alert in response to not receiving location information of the computing device.

8. The method of claim 1, further comprising:
triggering an alert in response to receiving location information indicative of the computing device being in a wrong location.

9. The method of claim 1, wherein the tag is a radio-frequency identification (RFID) tag and sensing the value of the tag comprises sensing a radio frequency signal encoding a unique identifier of the RFID tag with a radio receiver of the tag reader.

10. The method of claim 1, wherein the tag is an optical code tag and sensing the value of the tag comprises sensing a spatially modulated pattern of light encoding an identifier with an optical code scanner of the tag reader.

11. The method of claim 10, wherein the optical code scanner is a barcode scanner.

12. The method of claim 1, wherein sensing the value of the tag comprises sensing an identifier unique within a data center with a near-field communications (NFC) sensor of the tag reader.

13. The method of claim 1, comprising:
inserting the rack computing device into a receptacle in the rack;
aligning a wireless transmitter of the tag with a wireless receiver of the tag reader within the receptacle of the rack, before inserting the rack computing device;
bringing the wireless transmitter from being out of range of the wireless receiver when beginning to insert the rack computing device to being in range of the wireless receiver when the rack computing device is fully inserted into the receptacle;
transmitting a unique identifier from the wireless transmitter to the wireless receiver, wherein the unique identifier uniquely associates the receptacle with the rack computing device among other receptacles in the rack.

14. The method of claim 13, wherein
the wireless receiver is powered by an electrical connection established concurrent with, and a result of, sliding the rack computing device into the receptacle in the rack that couples the blind mate power adaptor of the rack computing device with the blind mate power bus of the rack, wherein the blind mate power adaptor is a bus bar adaptor and the blind mate power bus is a bus bar and the bus bar adaptor is aligned with the bus bar concurrent with the sliding the rack computing device into the receptacle in the rack.

15. The method of claim 13, wherein:
the wireless transmitter does not have a battery or a wired connection to a power source.

16. The method of claim 13, wherein:
the wireless transmitter is inductively powered by the wireless receiver.

17. The method of claim 1, wherein:
the rack holds a plurality of computing devices including the rack computing device, each computing device being in spaced relation with a different respective rack-mounted wireless transmitter configured to emit a wireless signal encoding a different identifier;
the rack comprises a direct current (DC) power bus configured to power operation of the rack computing device via the blind mate power bus;
the rack comprises a rack controller having a processor, a memory, and a powerline modem operative to send commands to, and receive data from the rack computing device via the DC power bus; and
the blind mate power adaptor of the rack computing device comprising:
a powerline modem;
a microcontroller operative to execute commands sent by the rack controller, the commands including requests for location of the rack computing device; and
wherein the tag reader is configured to obtain location information of the rack computing device from one of the wireless transmitters and provide the location information to the microcontroller, wherein a range of the wireless transmitters is less than 20 centimeters.

18. The method of claim 1, wherein the rack-mounted. computing device is connected to a power drop, the method further comprising:
sending, via the blind mate power adaptor coupled to the blind mate power bus of the rack, a unique identifier of the power drop indicating which one of a plurality of power drops in a data center provides power to the rack computing device.

19. The method of claim 18, wherein the unique identifier of the power drop is sent each time the computing device is connected to the power drop.

20. The method of claim 18, further comprising:
identifying power allocation within a plurality of racks, the plurality of racks including the rack, and wherein the identifying includes user interface visualization of the power allocation.

21. The method of claim 1, further comprising:
sensing with the tag reader a signal transmitted by the tag, wherein the tag reader comprises non-volatile memory to store sensing information, and wherein the sensing information includes rack count.

22. The method of claim 1, wherein:
the rack holds a plurality of computing devices including the rack computing device, each computing device being in spaced relation with a different respective rack-mounted wireless transmitter configured to emit a wireless signal encoding a different identifier;
the rack comprises a direct current (DC) power bus configured to power operation of the rack computing device via the blind mate power bus;
the rack comprises a rack controller having a processor, a memory, and a powerline modem operative to send commands to, and receive data from the rack computing device via an Ethernet control network or data network; and
the blind mate power adaptor of the rack computing device comprising:
  a powerline modem;
  a microcontroller operative to execute commands sent by the rack controller, the commands including requests for location of the rack computing device; and
  wherein the tag reader is configured to obtain location information of the rack computing device from one of the wireless transmitters and provide, via Ethernet control network or data network, the location information to the microcontroller.

23. The method of claim 1, further comprising:
sending, with an Ethernet control network, identification information (ID) of the rack-mounted computing device with the location information.

24. The method of claim 1, further comprising:
sending, with an Ethernet control network, additional sensing information with the location information, wherein the additional sensing information includes presence, condition, state, motion, or environmental information.

25. The method of claim 1, wherein the location information is sent with an Ethernet control network each time the computing device is placed into a new location.

26. The method of claim 1, wherein additional sensing information is sent in association with the location information, the additional sensing information including at least one temperature reading sensed by the rack computing device.

27. The method of claim 26, further comprising:
receiving, by a rack controller, the additional sensing information and the location information; and
transmitting, by the rack controller, based on the at least one temperature reading sensed by the rack computing device and the location of the rack computing device, a signal to adjust a thermal control unit not controlled by the rack computing device but associated with the location of the rack computing device.

* * * * *